(12) United States Patent
Ivry et al.

(10) Patent No.: US 12,268,101 B2
(45) Date of Patent: Apr. 1, 2025

(54) SUPERCONDUCTOR COMPOSITES AND DEVICES COMPRISING SAME

(71) Applicant: TECHNION RESEARCH & DEVELOPMENT FOUNDATION LIMITED, Haifa (IL)

(72) Inventors: Yachin Ivry, Haifa (IL); Mohammad Suleiman, Haifa (IL)

(73) Assignee: TECHNION RESEARCH &DEVELOPMENT FOUNDATION LIMITED, Haifa (IL)

( * ) Notice: Subject to any disclaimer, the term of this patent is extended or adjusted under 35 U.S.C. 154(b) by 238 days.

(21) Appl. No.: 17/762,554

(22) PCT Filed: Sep. 22, 2020

(86) PCT No.: PCT/IL2020/051031
§ 371 (c)(1),
(2) Date: Mar. 22, 2022

(87) PCT Pub. No.: WO2021/053682
PCT Pub. Date: Mar. 25, 2021

(65) Prior Publication Data
US 2022/0376162 A1 Nov. 24, 2022

Related U.S. Application Data

(60) Provisional application No. 62/991,654, filed on Mar. 19, 2020, provisional application No. 62/903,858, filed on Sep. 22, 2019.

(51) Int. Cl.
*H10N 60/81* (2023.01)
*H10N 60/01* (2023.01)
*H10N 60/80* (2023.01)

(52) U.S. Cl.
CPC ....... *H10N 60/815* (2023.02); *H10N 60/0912* (2023.02); *H10N 60/805* (2023.02)

(58) Field of Classification Search
CPC ............ H10N 60/815; H10N 60/0912; H10N 60/805; H10N 60/12; H10N 60/85; B82Y 40/00; G11C 11/44
See application file for complete search history.

(56) References Cited

U.S. PATENT DOCUMENTS 4,997,719 A * 3/1991 Ohshima ............... B32B 27/281
428/930
5,340,796 A 8/1994 Cava et al.
(Continued)

FOREIGN PATENT DOCUMENTS

EP 0303036 B1 5/1993
WO 2013093905 A1 6/2013

OTHER PUBLICATIONS

Laminated Plastics, "Technical Data Sheet", All Pages.*
(Continued)

*Primary Examiner* — Fernando L Toledo
*Assistant Examiner* — Marshall Mu-Nuo Hatfield
(74) *Attorney, Agent, or Firm* — The Roy Gross Law Firm, LLC; Roy Gross

(57) ABSTRACT

Compositions comprising a) one or more amorphous superconductor layers bound to one or more flexible substrate layers, or b) one or more superconductor layers bound to one or more layers of a high dielectric material are disclosed. Furthermore, provided herein are articles comprising one or more compositions of the invention and method of manufacturing thereof.

4 Claims, 22 Drawing Sheets

(56) References Cited

U.S. PATENT DOCUMENTS

| | | | | |
|---|---|---|---|---|
| 5,364,836 | A * | 11/1994 | Dynes | H10N 60/12 |
| | | | | 428/688 |
| 9,324,767 | B1 * | 4/2016 | Steinbach | H10N 69/00 |
| 10,847,706 | B2 | 11/2020 | Ivry et al. | |
| 2002/0105080 | A1 | 8/2002 | Speakman | |
| 2003/0051664 | A1 | 3/2003 | Stanbery | |
| 2006/0113992 | A1 | 6/2006 | Tilbrook et al. | |
| 2008/0103052 | A1 | 5/2008 | Ignatiev et al. | |
| 2010/0072061 | A1 * | 3/2010 | Morohashi | C23C 14/35 |
| | | | | 204/298.12 |
| 2014/0087952 | A1 * | 3/2014 | Nam | G01J 1/0425 |
| | | | | 505/181 |
| 2015/0302956 | A1 * | 10/2015 | Briatico | G11C 11/54 |
| | | | | 338/20 |
| 2016/0083872 | A1 * | 3/2016 | Zhang | C23C 16/44 |
| | | | | 264/164 |
| 2016/0148112 | A1 * | 5/2016 | Kwon | H10N 69/00 |
| | | | | 257/31 |
| 2016/0268048 | A1 * | 9/2016 | Zelner | H01G 4/012 |
| 2018/0248103 | A1 * | 8/2018 | Ivry | G01J 5/046 |
| 2020/0043550 | A1 * | 2/2020 | Kenyon | H10N 70/026 |

OTHER PUBLICATIONS

Thin Films of Metal Mixed Plastic Superconductors (Year: 2018).*
Bao, P., Jackson, T. J., Wang, X., & Lancaster, M. J. (2008). Barium strontium titanate thin film varactors for room-temperature microwave device applications. Journal of physics D: applied physics, 41(6), 063001. DOI 10.1088/0022-3727/41/6/063001.
Kondo, S. Superconducting characteristics and the thermal stability of tungsten-based amorphous thin films. Journal of Materials Research 7, 853-860 (1992). https://doi.org/10.1557/JMR.1992.0853.
Suleiman, M., Torre, E. G. D., & Ivry, Y. (2020). Flexible amorphous superconducting materials and quantum devices with unexpected tunability. arXiv preprint arXiv:2002.10297. https://doi.org/10.48550/arXiv.2002.10297.
PCT International Search Report for International Application No. PCT/IL2020/051031, mailed Jan. 17, 2021, 9pp.
PCT Written Opinion for International Application No. PCT/IL2020/051031, mailed Jan. 17, 2021, 6pp.
PCT International Preliminary Report on Patentability for International Application PCT/IL2020/051031, issued Mar. 15, 2022, 7pp.

* cited by examiner

SUPERCONDUCTOR COMPOSITES AND DEVICES COMPRISING SAME

CROSS REFERENCE TO RELATED APPLICATIONS

This application is a National Phase of PCT Patent Application No. PCT/IL2020/051031 having International filing date of Sep. 22, 2020, which claims the benefit of priority under 35 USC § 119 (e) of U.S. Provisional Patent Application Nos. 62/903,858, filed Sep. 22, 2019 and 62/991,654, filed Mar. 19, 2020, both entitled "SUPERCONDUCTOR COMPOSITES AND DEVICES COMPRISING SAME" the contents of which are incorporated herein by reference in their entirety.

FIELD OF THE INVENTION

The invention relates generally to the field of composite superconductor materials and articles comprising same.

BACKGROUND

The growing demand for data storage and computing encompasses a considerable increase in the global electrical-power. Modern data centers are built with Complementary Metal Oxide Semiconductor (CMOS) logic and their power consumption reach tens of mega Watts. With the end of Dennard's scaling and the slowdown of Moore's law, the increase demand for data and computation requires a technological shift. While the delay of Single-Flux Quantum (SFQ) logic is as low as CMOS, its energy is four to five orders of magnitude lower. Therefore, it is projected that supercomputers that are based on SFQ technology will have substantially lower power and energy.

SFQ logic is however very different than CMOS technology. It is based on superconducting devices and require cryogenic temperatures. The computation is performed in picosecond pulses produced by Josephson junctions (JJs), enabling high frequencies of up to 100 GHz. Hence, there is a need in developing quantum materials, devices and systems that allow this non-classical, high-speed and low-power data computation and storage.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

In one aspect of the invention, there is provided a composition comprising one or more amorphous superconductor layers bound to one or more substrate layers, wherein the one or more substrate layers comprises any of: a Van der Waals material, an amorphous material, or a combination thereof.

In one embodiment, the amorphous material comprise a non-metallic material selected from the group consisting of: a polymeric material, a glass material, or any combination thereof.

In one embodiment, the polymeric material comprises any of: polyamide, polyphthalamide, polyimide, PET (polyethylene terephthalate), PEN (polyethylene naphthalate), PES (polyethersulfone), polypropylene, polyethylene, polypropylene sulfide, polycarbonate, polyetherimide, polyphenylene sulfide, polyphenylene oxide, polysulfone, polyester, polyvinyl fluoride, polystyrene (PS), poly(n-alkyl methacrylate) (PnAMA), poly(n-butyl methacrylate) (PBMA), poly (methyl methacrylate) (PMMA), poly(ferrocenyldimethylsilane) (PFDMS), poly(dimethylsil oxane) (PDMS), polyisoprene, (PI), poly(ethylene-co-propylene) (PEP), polybutadiene (PB), poly(ethylene oxide) (PEO), poly(ferrocenylethylmethylsilane) (PFEMS), poly(tert-butyl methacrylate) (PtBMA), poly(methylstyrene) (PMS), poly(hydroxystyrene) (PHS), and poly(vinylpyridine) (PVP), polyvinyl alcohol (PVA), and polyvinyl chloride (PVC) or any combination thereof.

In one embodiment, the composition is stable at a temperature between 0 and 350K.

In one embodiment, the one or more amorphous substrate layers is an elastic layer.

In one embodiment, the composition is stable to deformation.

In one embodiment, the stable composition is characterized by maintenance of least 90% of structural intactness thereof.

In one embodiment, the composition is characterized by superconductivity at a temperature below a critical temperature of the superconductor.

In one embodiment, the one or more amorphous superconductor layers comprise an element selected from the group consisting of: tungsten (W), molybdenum (Mo), titanium (Ti), tantalum (Ta), niobium (Nb), nickel (Ni), cobalt (Co), zirconium (Zr), lanthanum (La), germanium (Ge), gallium (Ga), lead (Pb), beryllium (Be), zinc (Zn), ruthenium (Ru), rhodium (Rh), bismuth (Bi), indium (In), tin (Sn), antimony (Sb), palladium (Pd), gold (Au), thallium (Tl), tellurium (Te), osmium (Os), copper (Cu), iridium (Ir), nitrogen (N), oxygen (O), sulfur (S) and silicon (Si) or any combination thereof.

In one embodiment, wherein each of the one or more amorphous superconductor layers comprise any of: a metal silicide, a metal nitride, a metal oxide, a metal sulfide and a plurality of metals, wherein the metal(s) is selected from the group consisting of: tungsten (W), molybdenum (Mo), titanium (Ti), tantalum (Ta), niobium (Nb), nickel (Ni), cobalt (Co), zirconium (Zr), lanthanum (La), germanium (Ge), gallium (Ga), lead (Pb), beryllium (Be), zinc (Zn), ruthenium (Ru), rhodium (Rh), bismuth (Bi), indium (In), tin (Sn), palladium (Pd), gold (Au), antimony (Sb), thallium (Tl), tellurium (Te), osmium (Os), copper (Cu), and iridium (Ir) or any combination thereof.

In one embodiment, the one or more amorphous superconductor layers comprise any of: tungsten silicide, gallium silicide, and molybdenum silicide.

In one embodiment, the one or more amorphous superconductor layers have an average thickness from 0.1 nm to 1 um.

In one embodiment, the composition further comprises an additional layer.

In one embodiment, the additional layer comprises a material selected from the group consisting of: a superconductive material, an insulating layer, a ferromagnetic material, a polymeric material, a glass material, and a metallic material or a combination thereof.

In another aspect of the invention, there is provided a composition comprising one or more superconductor layers bound to one or more layers of a high dielectric material.

In one embodiment, the high dielectric material comprises any of: an insulator, a ferroelectric material, a ferromagnetic material, a piezoelectric material, and a pyroelectric material.

In one embodiment, the composition maintains at least 90% of its structural intactness at a temperature between 0 and 350K.

In one embodiment, bound is via a non-covalent bond.

In one embodiment, the one or more superconductor layers have an average thickness from 0.1 nm to 1 um.

In one embodiment, the composition further comprises an additional layer.

In one embodiment, the additional layer comprises a material selected from the group consisting of: a superconducting material, a ferromagnetic material, a polymeric material, a glass material, and a metallic material or a combination thereof.

In another aspect of the invention, there is provided an article, comprising a composition of the invention.

In one embodiment, the article is in form of a Josephson Junction (JJ).

In one embodiment, the JJ further comprises a ferroelectric material layer bound to a superconductor material layer.

In one embodiment, the superconductivity of the JJ is controllable by inducing a polarization of the ferroelectric material layer.

In one embodiment, the tunneling properties of the ferroelectric material layer are controllable by applying supercurrent to the JJ.

In one embodiment, a quantum state of the JJ is predetermined by the polarization of the ferroelectric material layer.

In one embodiment, the article is a quantum device.

In one embodiment, the article is in form of a superconducting quantum interference device (SQUID), comprising one or more JJs.

In one embodiment, the SQUID has a controllable physical value, wherein the physical value is selected from the group consisting of: a critical magnetic field, a critical current, a critical temperature, a superconducting current, photoresistance and magnetic inductance or any combination thereof.

In one embodiment, the SQUID is characterized by controllable sensitivity to a magnetic field.

In one embodiment, the physical value and the sensitivity are dependent on a geometric shape of the SQUID, wherein the geometric shape is a planar shape or a non-planar shape.

In one embodiment, the SQUID is configured to detect any of: a magnetic field, and a photon.

In one embodiment, the article is configured to form any of: a memristor, a power-efficient computing device, a power-efficient data storage device, a quantum computing device (e.g. quantum memory, quantum bit), a light detector (e.g. a superconducting wire single photon detector (SSPD)), bolometer (e.g. transition edge sensor), or a kinetic-inductance device.

In another aspect of the invention, there is provided a method of manufacturing a superconductor layer bound to substrate, comprising the steps of:
a. introducing a substrate into an ambient of reduced pressure, wherein the substrate being under controlled temperature;
b. providing a target under conditions sufficient for sputtering, wherein the target comprises one or more elements selected from the group consisting of: tungsten (W), molybdenum (Mo), titanium (Ti), tantalum (Ta), niobium (Nb), nickel (Ni), cobalt (Co), zirconium (Zr), lanthanum (La), germanium (Ge), gallium (Ga), lead (Pb), beryllium (Be), zinc (Zn), ruthenium (Ru), rhodium (Rh), bismuth (Bi), indium (In), tin (Sn), palladium (Pd), gold (Au), osmium (Os), iridium (Ir), nitrogen (N), oxygen (O) and silicon (Si) or any combination thereof; and
c. sputtering the one or more elements onto the substrate, thereby manufacturing the superconductor layer on the substrate.

In one embodiment, the method further comprises repeating step (c), thereby manufacturing a plurality of superconductor layers on the substrate.

In one embodiment, controlled temperature is less than 70° C.

In one embodiment, conditions comprise vacuum and plasma irradiation.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

FIG. 1A is a schematic representation of a flexible superconducting quantum interference device. FIG. 1B represents a circuit diagram of the flexible superconducting quantum interference device, wherein the current circulates in a loop comprising two parallel weak links.

FIG. 3A: ferroelectric (FE)-superconducting (SC) stack (continuous films of patterns), the polarization of the ferroelectric suppresses locally the superconducting properties, e.g. decreasing $I_C$. FIG. 3B: the ferroelectric polarization can be artificially manipulated for switching $I_C$ between suppressed and enhanced states, i.e. a bit element. FIG. 3C: the switched weak link can be wired in parallel to either a bear superconducting weak link or to a twin ferroelectric-superconducting element with tunable superconducting properties (FIG. 3D) to complete the fluxon-based binary device. The arrow represents the direction of current (I).

FIG. 6A: Polarization-induced weak link. FIG. 6B: Polarization-induced weak link combined with a three-terminal superconducting switching device. FIG. 6C is an illustration representing a non-limiting configuration of an exemplary device of the invention incorporating a three-terminal superconducting switching device interfering with an unperturbed weak link, so as to allow introducing memristivity to the quantum switching device.

FIG. 7A, FIG. 7C and FIG. 7E indicate the input current of the model, and the FIG. 7B, FIG. 7D and FIG. 7F indicate the response of the system. FIG. 7A and FIG. 7B: Low current: the FE is in the "on" state and the Josephson junction behaves as a superconductor. FIG. 7C and FIG. 7D: High current: the FE is in the "off" state and the Josephson junction behaves as a normal conductor (finite voltage). FIG. 7E and FIG. 7F: Hysteretic behavior: the current is swept slowly from $I_0$ to $I_{max}$ and vice versa.

FIG. 10A: Superconducting loop made of an ultra-thin (~5 atomic monolayers) NbN film and comprises two parallel patterned JJs. FIG. 10B: A similar nano-SQUID made of a niobium film, with the exception that one of the JJs is a three-terminal junctions that allows current gating for local tunability of pseudo wavefunction (W).

FIG. 16A is a graph representing tunability (decrease) of the critical current of a SQUID of the invention by biasing ferroelectric substrate upon which the superconductive device is placed. FIG. 16B is a graph representing a calculated maximal magnetic-field augmentation due to lensing for various curvatures of a SQUID of the invention.

DETAILED DESCRIPTION

Figure 1A:
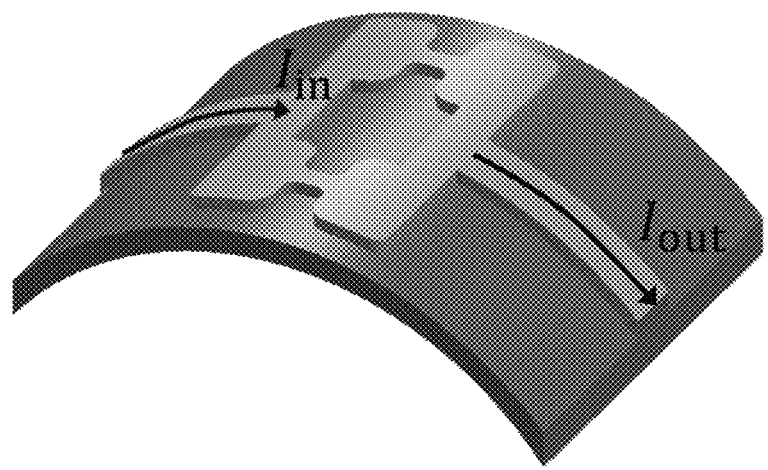
FIGS. 1A-B show exemplary configurations of flexible superconducting quantum interference devices.

The present invention, in one aspect thereof, relates to a composition comprising one or more amorphous superconductor layers bound to one or more substrate layers, wherein the one or more substrate layers comprises any of: a Van der Waals material, an amorphous material, or a combination thereof. In some embodiments, the one or more substrate layers is an elastic layer. In some embodiments, the amorphous material is selected from the group consisting of: a polymeric material, and a glass material or a combination thereof. In some embodiments, the composition comprising one or more amorphous superconductor layers bound to one or more substrate layers is further in contact with an additional layer.

In another aspect, the present invention relates to a composition comprising one or more superconductor layers bound to one or more layers of a high dielectric material. In some embodiments, the high dielectric material is selected from a ferromagnetic material, a ferroelectric material, a piezoelectric material, and a pyroelectric material. In some embodiments, the high dielectric material is a ferroelectric material.

In another aspect, the present invention relates to an article comprising a Josephson Junction (JJ). In some embodiments, JJ comprises one or more superconductor layers bound to one or more layers of a high dielectric material. In some embodiments, the article is a superconducting quantum interference device (SQUID), comprising one or more JJs. In some embodiments, the quantum state of the article is controllable. In some embodiments, the article is characterized by controllable physical value, such as: a critical magnetic field, a critical current, a critical temperature, a superconducting current, photoresistance and magnetic inductance or any combination thereof.

In another aspect, the present invention relates to a method of manufacturing the composition of the invention.

Before explaining at least one embodiment of the invention in detail, it is to be understood that the invention is not necessarily limited in its application to the details set forth in the following description or exemplified by the Examples. The invention is capable of other embodiments or of being practiced or carried out in various ways.

The Amorphous Composition

In one aspect of the invention, there is provided a composition (also referred to herein as amorphous composition), comprising: one or more amorphous superconductors bound to one or more substrate layers, wherein the one or more substrate layers comprises any of: a Van der Waals material, an amorphous material, or a combination thereof.

In some embodiments, one or more amorphous superconductors comprise a metal. Non-limiting examples of metals include but are not limited to: tungsten (W), molybdenum (Mo), titanium (Ti), tantalum (Ta), niobium (Nb), nickel (Ni), cobalt (Co), zirconium (Zr), lanthanum (La), germanium (Ge), gallium (Ga), lead (Pb), beryllium (Be), zinc (Zn), ruthenium (Ru), rhodium (Rh), bismuth (Bi), indium (In), tin (Sn), palladium (Pd), gold (Au), antimony (Sb), thallium (Tl), tellurium (Te), osmium (Os), copper (Cu), and iridium (Ir) or any combination thereof.

In some embodiments, one or more amorphous superconductors further comprise a non-metal. Non-limiting examples of non-metals include but are not limited to: nitrogen (N), oxygen (O), sulfur (S), and silicon (Si) or any combination thereof.

In some embodiments, one or more amorphous superconductors comprise any one of: NbGe, WGe, GaGe, and MoGe.

In some embodiments, one or more amorphous superconductors comprise a uni-element material. In some embodiments, one or more amorphous superconductors comprise a plurality of materials. In some embodiments, one or more amorphous superconductors comprise a plurality of elements. The stoichiometric ratio of the plurality of elements within the amorphous superconductor may be variable, depending on the exact manufacturing conditions. In some embodiments, the stoichiometric ratio of the plurality of elements within the amorphous superconductor layer may be the same. In some embodiments, the stoichiometric ratio of the plurality of elements within the amorphous superconductor layer may be different.

In some embodiments, one or more amorphous superconductors comprise any of: a metal silicide, a metal nitride, a metal oxide, and a metal sulfide, wherein the metal is as described hereinabove.

In some embodiments, one or more amorphous superconductors is MoSi (e.g. $Mo_{81}Si_{19}$), and/or WSi ($W_{60}Si_{40}$). Other amorphous superconductors are well-known in the art.

As used herein, the term "amorphous" relates to a solid structure having dense random packing of atoms within the structure. In some embodiments, the amorphous superconductor is substantially devoid of atoms having a well-defined (e.g. periodical) three-dimensional structure. In some embodiments, the amorphous superconductor is substantially devoid of a crystal lattice. In some embodiments, at least 50%, at least 60%, at least 70%, at least 80%, at least 90%, at least 95%, at least 99%, at least 99.9% of the entire amorphous superconductor layer is devoid of crystal lattice. In some embodiments, at least 50%, at least 60%, at least 70%, at least 80%, at least 90%, at least 95%, at least 99%, at least 99.9% of the atoms within the amorphous superconductor is randomly packed (e.g. have a rand 3D pattern or 3D structure).

In some embodiments, one or more amorphous superconductors retains its amorphous structure and its superconductivity (e.g. being stable) at a temperature in a range from 0 to 350K, from 0 to 5K, from 5 to 10K, from 10 to 20K, from 20 to 30K, from 30 to 50K, from 50 to 100K, from 100 to 150K, from 150 to 200K, from 200 to 250K, from 250 to 300K, from 300 to 350K, including any range therebetween.

In some embodiments, one or more amorphous superconductors retains its amorphous structure at a temperature greater than 400K, greater than 600K greater than 800K greater than 1000K greater than 1200K greater than 1400K.

In some embodiments, one or more amorphous superconductor layers is substantially devoid of any of the substrate materials, such as a crystalline superconductor metal, a glass material, a Van der Waals material or any combination thereof.

In some embodiments, one or more substrate layers is substantially devoid of any of the superconducting materials (e.g. amorphous, and/or crystalline superconductors), as described herein.

In some embodiments, the amorphous composition comprises one or more amorphous superconductors in contact with at least a part of a substrate, wherein the substrate is as described hereinbelow. In some embodiments, the amorphous composition comprises one or more amorphous superconductors bound to at least a part of a substrate. In some embodiments, the amorphous composition comprises atoms of one or more amorphous superconductors randomly deposited on a substrate. In some embodiments, the atoms of one or more amorphous superconductors are in close proximity to each other, so as to form a surface characterized by superconductivity.

In some embodiments, the atoms of one or more amorphous superconductors are bound to a substrate via a covalent bond, a non-covalent bond or both.

In some embodiments, the atoms of one or more amorphous superconductors form a coordinative bond to a substrate. In some embodiments, the atoms of one or more amorphous superconductors form a non-covalent bond to a substrate, wherein the non-covalent bond comprises is any of: electrostatic interaction, Van der Waals bond, hydrogen bond, dipole-dipole interaction, or a combination thereof.

Non-limiting examples of superconductor material include but are not limited to NbN, NbTi, GeNb, MoSi, MoGe, WSi, NbSi, YBCO, $MgB_2$, LaOFeAs, carbon nanotube, or any combination thereof. Other superconductors are well-known in the art.

In some embodiments, the amorphous composition comprises one or more amorphous superconductor layers bound to one or more substrate layers, wherein the one or more substrate layers comprises any of: a Van der Waals material, an amorphous material, or a combination thereof. In some embodiments, the amorphous composition comprises one amorphous superconductor layer. In some embodiments, the amorphous composition comprises a plurality of amorphous superconductor layers.

In some embodiments, the composition of the invention is a layered composition. In some embodiments, the composition of the invention is a multi-layer composition. In some embodiments, the composition of the invention comprises consecutive layers, wherein the layers comprise any of the amorphous superconductor layer and the substrate layer.

In some embodiments, the one or more amorphous superconductor layers comprise the amorphous superconductor as described hereinabove. In some embodiments, any of the one or more amorphous superconductor layers comprise one or more amorphous superconductors.

In some embodiments, any of the one or more amorphous superconductor layer (also referred to herein as superconductor layer) is characterized by a uniform thickness. In some embodiments, the superconductor layer is characterized by a non-uniform thickness. In some embodiments, the superconductor layer is characterized by a variable thickness. In some embodiments, the superconductor layer is characterized by a variable stoichiometry of the materials.

In some embodiments, the superconductor layer is an atomic layer. In some embodiments, the superconductor layer comprises a plurality of atomic layers.

In some embodiments, the superconductor layer has an average thickness from 0.1 nm to 10 um, from 0.1 nm to 0.5 nm, from 0.5 nm to 1 nm, from 1 nm to 5 nm, from 5 nm to 10 nm, from 10 nm to 20 nm, from 20 nm to 30 nm, from 30 nm to 50 nm, from 50 nm to 100 nm, from 100 nm to 200 nm, from 200 nm to 300 nm, from 300 nm to 500 nm, from 500 nm to 1 um, from 1 um to 5 um, from 5 um to 10 um, including any range therebetween.

In some embodiments, the superconductor layer has an average thickness that maintains an amorphous state of the superconductor. In some embodiments, the superconductor within the superconductor layer is substantially in an amorphous state.

As used herein, the term substantially refers to a weight per weight (w/w) concentration of at least 70%, at least 75%, at least 80%, at least 80%, at least 85%, at least 90%, at least 95%, at least 96%, at least 97%, at least 98%, at least 99% of the amorphous superconductor within the superconductor layer.

In some embodiments, the superconductor layer has a predetermined average thickness. In some embodiments, the average thickness of the superconductor layer is predetermined by a manufacturing method, as described hereinbelow.

In some embodiments, the superconductor layer is a coating layer. In some embodiments a coating layer as described in any of the respective embodiments is incorporated on at least a portion of at least one surface of the substrate.

According to an aspect of some embodiments of the present invention, there is provided a substrate having incorporated on at least a portion thereof the superconductor layer as described herein.

By "a portion thereof" it is meant, for example, a surface or a portion thereof, and/or a body or a portion thereof, of a solid or a semi-solid substrate.

In some embodiments, the substrate is an amorphous substrate. In some embodiments, the substrate is a non-crystalline substrate. In some embodiments, the substrate is a non-metallic substrate. In some embodiments, the substrate is a non-metallic amorphous substrate. In some embodiments, the substrate is substantially devoid of any crystalline material. In some embodiments, the substrate is substantially devoid of any metal. In some embodiments, the substrate is substantially devoid of any crystalline metal.

In some embodiments, the amorphous substrate comprises one or more layers. In some embodiments, one or more layers of the amorphous substrate comprises any of: a polymeric material, a glass material or both.

In some embodiments, the polymeric material comprises any of: polyamide, polyphthalamide, polyimide, PET (polyethylene terephthalate), PEN (polyethylene naphthalate), PES (polyethersulfone), polypropylene, polyethylene, polypropylene sulfide, polycarbonate, polyetherimide, polyphenylene sulfide, polyphenylene oxide, polysulfone, polyester, polyvinyl fluoride, polystyrene (PS), poly(n-alkyl methacrylate) (PnAMA), poly(n-butyl methacrylate) (PBMA), poly(methyl methacrylate) (PMMA), poly(ferrocenyldimethylsilane) (PFDMS), poly(dimethylsiloxane) (PDMS), polyisoprene, (PI), poly(ethylene-co-propylene) (PEP), polybutadiene (PB), poly(ethylene oxide) (PEO), poly(ferrocenylethylmethylsilane) (PFEMS), poly(tert-butyl methacrylate) (PtBMA), poly(methylstyrene) (PMS), poly(hydroxystyrene) (PHS), and poly(vinylpyridine) (PVP), polyvinyl alcohol (PVA), and polyvinyl chloride (PVC) or any combination thereof.

In some embodiments, the polymeric material comprises an organic polymer (e.g. polyamide, polyphthalamide, polyimide, PET, PEN, PES, etc.), or an inorganic polymer (e.g. a silicon based polymer, such as polysiloxane or polysilazane). In some embodiments, the polymeric material is a hybrid material comprising a polymer and an additional component, such as a small particle (e.g. a metal-based particle, a carbon-nano tube, a nano-diamond, magnetic-based particles, optically active particles, and illuminating particles). In some embodiments, the polymer is a mixed polymer.

In some embodiments, the organic polymer comprises a plurality of polar monomers (e.g. polyester, polyamide, and polyimide). In some embodiments, the organic polymer comprises a plurality of hydrophobic monomers (e.g. PHS, PVC). In some embodiments, the organic polymer comprises a plurality of hydrophilic monomers (e.g. PEO, PVA).

In some embodiments, the amorphous substrate is poly (4,4'-oxydiphenylene-pyromellitimide).

In some embodiments, the substrate is a two-dimensional material. In some embodiments, the substrate is a Van der Waals material. As used herein, the term "two-dimensional material" relates to any material consisting of a single layer (sometimes 1-5 layers) of atoms or a stack of such layers. Two-dimensional material can be any of: graphene, graphite, fluorographene, boron nitride, metal chalcogenides (e.g. $MoS_2$, $WS_2$), and metal oxides ($TiO_2$, $MnO_2$, mica). Mica is a dielectric material of general formula: $X_2Y_{4-6}Z_8O_{20}(OH, F)_4$, wherein X is K, Na, or Ca; Y is Al, Mg, or Fe; Z is Si or Al.

In some embodiments, the substrate is mica.

In some embodiments, the substrate is characterized as being stable at a cryogenic temperature of less than 100K. In some embodiments, the substrate retains its physical stability at a cryogenic temperature. In some embodiments, the substrate maintains at least 90% of its structural intactness at a cryogenic temperature.

In some embodiments, the substrate is any of: a flexible substrate, a pliable substrate, a deformable substrate, a foldable substrate, and an elastic substrate. In some embodiments, the substrate is an elastic substrate. In some embodiments, the substrate is selected from an elastic polymer, and mica.

In some embodiments, the substrate comprises a first plain state and a second folded or curved state. In some embodiments, the substrate is in a form of a plain surface or of a curved surface.

In some embodiments, the substrate is an adhesive substrate, characterized by adhesiveness to a surface.

In some embodiments, the amorphous composition comprising one or more amorphous superconductors bound to one or more elastic substrate layers is also referred to herein an elastic composition. In some embodiments, the terms "amorphous composition", "flexible composition", and "elastic composition" are used herein interchangeably.

In some embodiments, the composition of the invention is any of: a flexible composition, a pliable composition, a deformable composition, a foldable composition, and an elastic composition.

In some embodiments, the composition of the invention comprises a first planar configuration and a second folded or curved configuration. In some embodiments, the composition of the invention is at least partially curved. In some embodiments, the composition of the invention is in a form of a plain surface or of a curved surface.

In some embodiments, the composition of the invention is capable of undergoing deformation, so as to provide the composition from a first planar configuration into a second folded or curved configuration, or vice versa.

In some embodiments, the shape of the composition is controllable. In some embodiments, the composition is characterized by a controllable curvature. In some embodiments, the composition remains stable (e.g. retains its superconductivity and retains its structural and/or mechanical properties) upon deformation. In some embodiments, the composition is deformable. In some embodiments, the composition is deformable as to obtain a predetermined shape or curvature.

In some embodiments, the composition of the invention retains its superconductivity upon deformation (e.g. bending). In some embodiments, the composition of the invention retains its superconductivity upon altering a curvature of the composition.

In some embodiments, the elastic composition is stable upon multiple strain cycles (i.e., applying force to induce strain or mechanical modification or mechanical deformation in the material, then removing the force allowing the material to relax).

As used herein, the terms "elasticity" and "elastic" refer to a tendency of a material to return to its original shape (within a deviation of ±10%) after being deformed by stress, for example, a tensile stress and/or shear stress.

As used herein, the term "stable" is referred to the ability of the composition to maintain at least 80%, at least 85%, at least 90% of its structural intactness. In some embodiments, the elastic composition maintains its elasticity at a temperature of less than 300K, less than 200K, less than 150K, less than 100K, less than 70K, less than 50K, less than 20K, less than 10K, including any range between.

In some embodiments, the amorphous composition is stable to a cryogenic temperature of less than 100K.

In some embodiments, the elastic composition is stable to a cryogenic temperature of less than 100K.

In some embodiments, the elastic composition is stable to deformation. In some embodiments, the elastic composition is stable to stress, wherein stable is as described herein.

In some embodiments, the elastic composition is flexible. In some embodiments, the elastic composition is foldable. In some embodiments, the elastic composition is stretchable. In some embodiments, the elastic composition is stable upon multiple strain cycles (i.e., applying force to induce strain or mechanical modification or mechanical deformation in the material, then removing the force allowing the material to relax).

As used herein, the term "deformation" relates to the ability of a material to extend beyond its original length when subjected to stress. Stress may be unidirectional, bi-directional, or multi-directional. Stress can be either applied along a longitudinal axis of the material, also referred to herein as stretching or compression; or it can be either applied along a transversal axis of the material, also referred to herein as bending. When applied to an elastic material, stress may induce an elastic deformation.

In some embodiments, the elastic composition is stable to stretching. In some embodiments, the elastic composition is stable to compression. In some embodiments, the elastic composition is stable to bending. In some embodiments, the elastic composition is stable to bending and stretching. In some embodiments, the elastic composition is stable to multiple bending cycles.

In some embodiments, the composition of the invention is characterized by superconductivity at a temperature below a critical temperature of the superconductor (e.g. on a silicon-based substrate) (FIGS. 2A-E). In some embodiments, the critical temperature of the composition of the invention remains substantially the same by implementing various substrate materials.

In some embodiments, the composition of the invention having a non-planar (e.g. curved) shape is characterized by superconductivity at a temperature below the critical temperature of the superconductor.

As used herein the term "critical temperature" refers to a temperature below which the resistance of a material drops abruptly to zero and the material becomes superconductive. The critical temperature is material specific, usually being in a range between 20K to less than 1K.

In some embodiments, the composition of the invention is a flexible composition characterized by superconductivity at a temperature below phase transition of the superconductor. In some embodiments, the amorphous superconductor maintains its superconducting properties when bound to a substrate, wherein the substrate is as described hereinabove.

Figure 12:
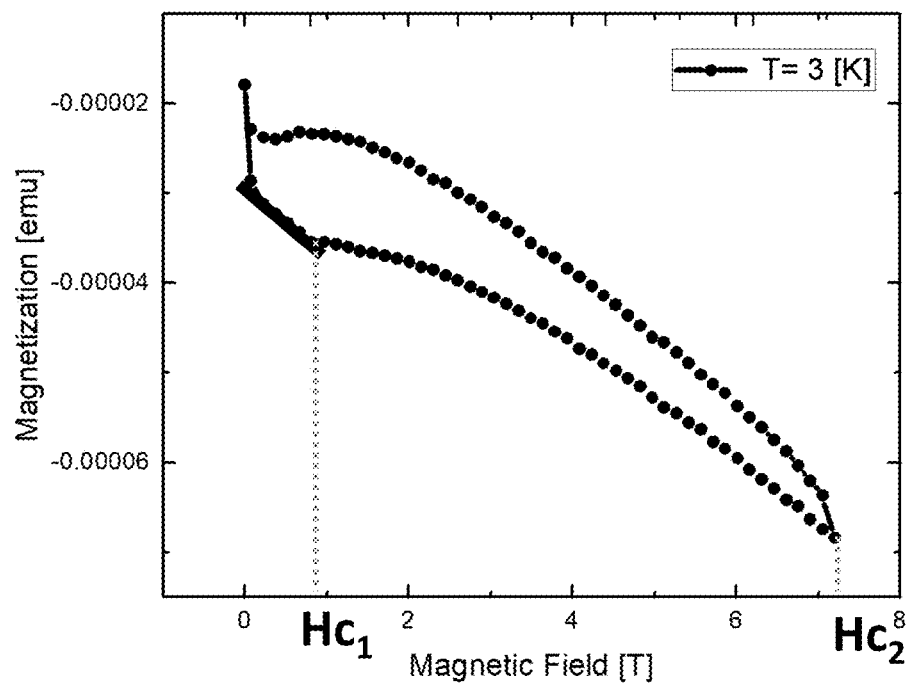
FIG. 12 is a graph representing magnetic field shielding of an exemplary composition of the invention comprising amorphous superconductor on top of a flexible substrate (kapton).

In some embodiments, the composition maintains its superconductivity upon bending and/or stretching. In some embodiments, the composition maintains its superconductivity upon relaxation. In some embodiments, the composition having a non-planar shape is characterized by superconductivity being substantially the same as the superconductivity of the planar composition. An exemplary non-planar (e.g. curved) superconductive composition is represented by FIG. 12B.

In some embodiments, a physical property of the composition is controllable or adjustable by deformation. In some embodiments, a physical property of the composition is controllable by altering a curvature of the composition. In some embodiments, a physical property comprises any of: a critical current, a critical temperature, a critical magnetic field, or any combination thereof. In some embodiments, a physical property of the composition is controllable by providing the composition from the first planar configuration into a second planar configuration.

In some embodiments, a physical property of a device (e.g. SQUID) is controllable or adjustable by altering the curvature of the device, as described hereinbelow.

In some embodiments, the composition maintains its superconducting properties upon heating and subsequent cooling below the critical temperature, wherein heating is to a temperature in a range from 0 to 350K, from 0 to 5K, from 5 to 10K, from 10 to 20K, from 20 to 30K, from 30 to 50K, from 50 to 100K, from 100 to 150K, from 150 to 200K, from 200 to 250K, from 250 to 300K, from 300 to 350K, including any range therebetween.

In some embodiments, the composition further comprises an additional layer. In some embodiments, the additional layer comprises a material selected from the group consisting of: a superconductive material, an insulating layer, a ferroelectric material, a ferromagnetic material, a polymeric material, a glass material, and a metallic material or a combination thereof. In some embodiments, the additional layer is in contact with the superconductor layer.

In some embodiments, the additional layer forms a top layer, being applied to the amorphous superconductor layer. In some embodiments, the top layer is a protective layer.

In some embodiments, the additional layer forms a bottom layer, being applied to the substrate layer. In some embodiments, the bottom layer provides a structural stability to the amorphous composition. In some embodiments, the bottom layer is an adhesive layer, comprising an adhesive polymer applied to the substrate layer. In some embodiments, the bottom layer provides adhesive properties to the amorphous composition.

In some embodiments, the composition comprising the additional layer is characterized by a controllable physical value, wherein the physical value is any of: a critical magnetic field, a critical current, a critical temperature, a superconducting current, photoresistance, and magnetic inductance or any combination thereof.

In some embodiments, the physical value is controllable or adjustable by applying to the composition comprising the additional layer any of: an electric field, light, a magnetic field, and a mechanical excitation, or a combination thereof.

In some embodiments, the physical one or more physical value of the apparatus is further controllable by changing temperature of the composition comprising the additional layer. In some embodiments, the physical one or more physical value of the apparatus is controllable by altering a curvature of the composition. In some embodiments, controllable is as described hereinbelow.

In some embodiments, the composition of the invention is for manufacturing a Josephson Junction (JJ) or an article comprising thereof. In some embodiments, the composition of the invention has one or more dimensions sufficient for inducing a tunneling current, as described herein. In some embodiments, the composition of the invention is for manufacturing a flexible or a deformable JJ, being characterized by at least one tunable or controllable physical value.

The Hybrid Composition

In another aspect of the invention, there is provided a composition (also referred to herein as hybrid composition), comprising one or more superconductor layers bound to one or more layers of a high dielectric material.

In some embodiments, one or more superconductor layers comprise a crystalline superconductor. In some embodiments, one or more superconductor layers comprise an amorphous superconductor. In some embodiments, the superconductor is as described hereinabove for amorphous superconductors.

Non-limiting example of superconductor material includes but are not limited to NbN, NbTi, GeNb, MoSi, MoGe, WSi, NbSi, YBCO, $MgB_2$, LaOFeAs, carbon nanotube, or any combination thereof. Other superconductors are well-known in the art.

In some embodiments, one or more layers of a high dielectric material comprises any of: an insulator, a ferroelectric material, a ferromagnetic material, a piezoelectric material, and a pyroelectric material or a combination thereof. Ferroelectric materials, ferromagnetic materials, piezoelectric materials, pyroelectric materials and insulators are known in the art.

In some embodiments, one or more layers of a high dielectric material comprises a pyroelectric material. Non-limiting examples of pyroelectric materials contain, but are not limited to: a ferroelectric material, a ferromagnetic material, and a piezoelectric material.

In some embodiments, one or more layers of a high dielectric material comprises a ferromagnetic material (e.g. nickel, cobalt, iron, gadolinium, permalloy, magnetite).

In some embodiments, one or more layers of a high dielectric material comprises a piezoelectric material (e.g. quartz, AlN, ZnO, a piezoelectric polymer, a perovskite structured piezoelectric material). In some embodiments, the hybrid composition comprising a piezoelectric material is configured to be tunable upon changing its shape (e.g. bending, stretching, compressing or a combination thereof).

In some embodiments, one or more layers of a high dielectric material comprises a ferroelectric material.

Non-limiting examples of ferroelectric materials contain, but are not limited to: perovskite type compounds (e.g. $BaTiO_3$, $PbTiO_3$, PZT ($Pb(Zr_x,Ti_{x-1})O_3$), PLZT (($Pb,La$)$(Zr_x,Ti_{x-1})O_3$)), wherein 0<x<1, lithium niobate and tantalate ($LiNbO_3$, $LiTaO_3$), organic polymer or polymeric composites (e.g. PVDF, PZT-polyethylene) bismuth oxide structured compounds (e.g. $BiFeO_3$), or any combination thereof. In some embodiments, a ferroelectric material further comprises a dopant. In some embodiments, the high dielectric material is characterized by ferroelectricity and ferromagnetism (e.g. $BiFeO_3$).

Non-limiting examples of ferromagnetic materials contain, but are not limited to: NiFePB, CoFeSiB, La0.7Sr0.3MnO3, $Sr_2FeMoO_6$, and $Fe_3O_4$ or any combination thereof.

In some embodiments, the hybrid composition comprises one or more superconductor layers bound to one or more layers of ferroelectric material.

In some embodiments, the hybrid composition comprises one or more superconductor layers bound to one or more layers of a ferroelectric material, wherein the ferroelectric material is PZT and the superconductor is any of: Nb, NbN, Mo-silicate, and W-silicate.

In some embodiments, the one or more superconductor layers or one or more layers of a high dielectric material have an average thickness 0.1 nm to 100 um, from 0.1 nm to 0.5 nm, from 0.5 nm to 1 nm, from 1 nm to 5 nm, from 5 nm to 10 nm, from 10 nm to 20 nm, from 20 nm to 30 nm, from 30 nm to 50 nm, from 50 nm to 100 nm, from 100 nm to 200 nm, from 200 nm to 300 nm, from 300 nm to 500 nm, from 500 nm to 1 um, from 1 um to 5 um, from 5 um to 10 um, from 10 um to 100 um, including any range therebetween.

In some embodiments, the one or more superconductor layer has a thickness sufficient for stabilizing the amorphous state of the superconductor (e.g. substantially preventing formation of a crystal lattice, so that the thickness of the amorphous superconductor layer is up to 100 um).

In some embodiments, the one or more superconductor layer comprise a crystalline superconductor, so that an average thickness of the one or more superconductor layer is between 0.1 nm to 10 mm, from 0.1 nm to 0.5 nm, from 0.5 nm to 1 nm, from 1 nm to 5 nm, from 5 nm to 10 nm, from 10 nm to 20 nm, from 20 nm to 30 nm, from 30 nm to 50 nm, from 50 nm to 100 nm, from 100 nm to 200 nm, from 200 nm to 300 nm, from 300 nm to 500 nm, from 500 nm to 1 um, from 1 um to 5 um, from 5 um to 10 um, from 10 um to 100 um, from 100 um to 1 mm, from 1 to 10 mm, including any range therebetween.

In some embodiments, the one or more superconductor layer comprises a crystalline superconductor, so that the thickness of the superconductor layer is up to several millimeters. In some embodiments, the thickness of the crystalline superconductor layer is limited by deformability or flexibility of the resulting device and/or of the superconductor layer. In some embodiments, the thickness of the high dielectric material layer is limited by deformability or flexibility of the resulting device and/or of the high dielectric layer. In some embodiments, the thickness of the any one of the layers is predetermined, so as to enable sufficient hybridization of the layers forming the device or the composition of the invention. In some embodiments, hybridization is as described herein.

In some embodiments, the hybrid composition comprises a substrate. In some embodiments, the substrate is flexible or deformable (as described herein).

In some embodiments, the hybrid composition comprises a bottom substrate layer, wherein an upper portion of the bottom layer is bound to a first layer. In some embodiments, the upper portion of the first layer is bound to a second layer, wherein each of the first and the second layer is independently selected from the superconductor layer and the high dielectric layer, as described herein.

To enhance and control the properties of the hybrid composition, the techniques described herein the proximity effect to combine at least one superconductor material with at least one high dielectric material to effectively form a new hybrid material.

The two (or more) materials as described hereinabove, can be disposed adjacent each other in the form of films, wires, or any geometric shape, provided that at least a portion of the hybrid composition have a dimension within 10 times the coherence length of the superconductor material, as described herein.

In various embodiments, each layer has a thickness less than 10 times the coherence length of the superconductor material. In particular embodiments, each layer has a dimension (e.g. thickness) being less than 10 times, less than 9 times, less than 8 times, less than 7 times, less than 6 times, less than 5 times, less than 4 times, less than 3 times, less than 2.5 times, less than 2 times, less than 1.5 times the coherence length of the superconductor material. The coherence length refers to the electon-electron distance (e.g. of the cooper pair) and is material dependent.

In some embodiments, the thickness of at least one layer within the hybrid composition is about 4 times the coherence length.

In some embodiments, the hybrid composition of the invention, being characterized by a thickness of each layer (e.g. being less than 10 times the coherence length) sufficient for hybridization. In some embodiments, at least one dimension (e.g. thickness of at least one layer) of the hybrid composition of the invention is sufficient for hybridization. As used herein the term "hybridization", refers to overlapping of atomic orbitals, so that the electrons in one layer can diffuse into another layer. Hybridization provides the hybrid composition the desirable properties of each individual layer.

In some embodiments, the hybrid composition of the invention has at least one dimension (e.g. thickness of at least one layer) sufficient for electron tunneling. In some embodiments, the hybrid composition of the invention has at least one dimension (e.g. thickness of at least one layer) sufficient for generating a tunnel current. In some embodiments, the tunnel current is generated between or throughout the layers of the hybrid composition. In some embodiments, the tunnel current is generated through the high dielectric material layer. In some embodiments, the tunnel current is generated along a vertical axis of the hybrid composition.

In some embodiments, provided herein the hybrid composition of the invention, wherein each layer of the hybrid composition has a dimension (e.g. thickness) being less than 10 times, less than 9 times, less than 8 times, less than 7 times, less than 6 times, less than 5 times, less than 4 times, less than 3 times, less than 2.5 times, less than 2 times, less than 1.5 times the coherence length of the superconductor material.

In some embodiments, the hybrid composition of the invention is for manufacturing a Josephson Junction (JJ) or an article comprising thereof.

In some embodiments, the hybrid composition comprises a high dielectric material layer sandwiched by two superconductor layers. In some embodiments, the hybrid composition comprises a multilayer structure comprising three or more layers bound to each other, wherein: a) the first layer is a superconductor, b) the second layer is a high dielectric material, and c) the third layer is a superconductor.

In some embodiments, the hybrid composition comprises a multilayer structure, wherein the high dielectric material comprises a material selected from a ferroelectric material, a ferromagnetic material, a piezoelectric material, a pyroelectric material and an insulator or any combination thereof. In some embodiments, the high dielectric material comprises a material selected from a ferroelectric material, a ferromagnetic material, a piezoelectric material, a pyroelectric material and an insulator or any combination thereof, wherein the dielectric material is in an amorphous state.

In some embodiments, the high dielectric material is a polarizable material. In some embodiments, the high dielectric material comprises an ionic compound. In some embodiments, the high dielectric material is an inorganic compound (e.g. a ceramic compound). In some embodiments, the high dielectric material is characterized by a dielectric constant of at least 100, at least 200, at least 300, at least 400, at least 500, at least 700, at least 1000, at least 1500, at least 2000, including any range therebetween. In some embodiments, the high dielectric material is characterized by a dielectric constant as described herein and by polarizability.

In some embodiments, the high dielectric material is a dielectric material characterized by a dielectric constant being greater than the dielectric constant of vacuum.

In some embodiments, the high dielectric material is an amorphous material. In some embodiments, the high dielectric material comprise any of an amorphous ferroelectric material, an amorphous ferromagnetic material, an amorphous piezoelectric material, an amorphous pyroelectric material or any combination thereof. In some embodiments, the thickness of the dielectric material layer is so that the dielectric material retains its amorphous structure.

In some embodiments, the hybrid composition is characterized by elasticity, wherein the elasticity is as described hereinabove. In some embodiments, the hybrid composition is an elastic hybrid composition. In some embodiments, the elastic hybrid composition further comprises an elastic substrate layer. In some embodiments, the elastic hybrid composition comprises an elastic or deformable substrate layer bound to any of: a superconductor, a high dielectric material or both. In some embodiments, the elastic or deformable substrate layer is as described hereinabove (e.g. for the amorphous composition).

In some embodiments, the hybrid composition of the invention comprises a first planar configuration and a second folded or curved configuration. In some embodiments, the hybrid composition of the invention is at least partially curved. In some embodiments, the hybrid composition of the invention is in a form of a plain surface or of a curved surface.

In some embodiments, the hybrid composition of the invention is capable of undergoing deformation, so as to provide the composition from a first planar configuration into a second folded or curved configuration, or vice versa.

In some embodiments, the shape of the hybrid composition is controllable. In some embodiments, the hybrid composition is characterized by a controllable curvature. In some embodiments, the hybrid composition remains stable (e.g. retains its superconductivity and retains its structural and/or mechanical properties) upon deformation. In some embodiments, the hybrid composition is deformable. In some embodiments, the hybrid composition is deformable as to obtain a predetermined shape or curvature. In some embodiments, any one of the layers of the hybrid composition (e.g. superconductor layer and/or high dielectric layer) is deformable.

In some embodiments, the hybrid composition maintains at least 90% of its structural intactness at a temperature in a range from 0 to 350K, from 0 to 5K, from 5 to 10K, from 10 to 20K, from 20 to 30K, from 30 to 50K, from 50 to 100K, from 100 to 150K, from 150 to 200K, from 200 to 250K, from 250 to 300K, from 300 to 350K, including any range therebetween.

In some embodiments, the hybrid composition further comprises an additional layer. In some embodiments, the additional layer is as described hereinabove for the amorphous composition.

In some embodiments, the hybrid composition of the invention is for manufacturing a Josephson Junction (JJ) or an article comprising thereof (e.g. SQUID). In some embodiments, the high dielectric layer of the hybrid composition of the invention is configured to control (e.g. enhance or reduce) a physical value of the superconductor layer, as described herein. In some embodiments, the hybrid composition of the invention is for manufacturing a flexible or a deformable JJ, being characterized by at least one tunable or controllable physical value.

Articles

In another aspect of the invention, there is provided an article comprising a composition of the invention, wherein the composition is as described herein above.

In some embodiments, the article comprises a substrate bound to one or more layers of an amorphous superconductor. In some embodiments, the article comprises the composition of the invention in contact with at least a part of a substrate. In some embodiments, the article comprises the composition in contact with at least a part of a substrate, wherein the composition comprises an amorphous or a crystalline superconductor, as described hereinabove. In some embodiments, the article comprises a substrate at least partially coated with the composition (also referred to herein as coated substrate). In some embodiments, coated is by adhesion to the substrate.

In some embodiments, the coated substrate obtains a planar shape. In some embodiments, the coated substrate has a planar geometry, being substantially flat. In some embodiments, the coated substrate has a planar geometry, being substantially in a single plane.

In some embodiments, the coated substrate obtains a non-planar shape. In some embodiments, the coated substrate has a non-planar geometry. In some embodiments, the composition of the invention adopts the shape of the substrate. In some embodiments, a non-planar shape comprises any tri-dimensional structure.

Non-limiting examples of non-planar shape contain but are not limited to: a sphere, an ellipse, a cube, a cylinder, a cone, a pyramid or any combination thereof.

In some embodiments, the coated substrate is magnetically shielded by one or more superconductor layers. In some embodiments, the coated substrate is magnetically shielded by one or more superconductor layers of the elastic composition.

In some embodiments, a composition of the invention (e.g. flexible or bendable composition) and/or the article comprising thereof, exhibits a complete magnetic-field shielding at magnetic field strength of up to 1 T. In some embodiments, a composition of the invention (e.g. flexible or bendable composition) and/or the article comprising thereof, exhibits a substantial magnetic-field shielding at magnetic field strength from 1 to 10 T, wherein substantial is as described herein.

In some embodiments, a composition of the invention (e.g. flexible or bendable composition) and/or the article comprising thereof, exhibits almost complete magnetic-field shielding at magnetic field strength of up to 7 T (see FIG. 11). Furthermore, magnetic-field shielding at magnetic field strength of up to 10 T has been demonstrated. Magnetic-field shielding at higher values (e.g. greater than 10 T) is currently under study.

In some embodiments, a composition of the invention (e.g. flexible or bendable composition) and/or the article comprising thereof, is configured to enhance magnetic field strength upon changing a curvature of the composition and/or the article. In some embodiments, magnetic field enhancement is by at least 2%, at least 3%, at least 5%, at least 7%, at least 10%, at least 15%, at least 20%, at least 30%, at least 40%, at least 50%, at least 70%, at least 100%, compared to the control including any range therebetween. In some embodiments, the control comprises the same composition being in a planar (e.g. non-curved) configuration (see FIG. 16B).

In some embodiments, a composition of the invention (e.g. flexible or bendable composition) and/or the article comprising thereof is configured to modify the direction of the magnetic field.

Figure 1B:
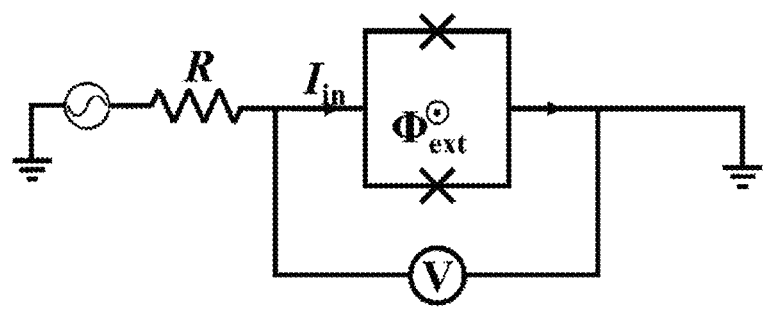
Figure 2:
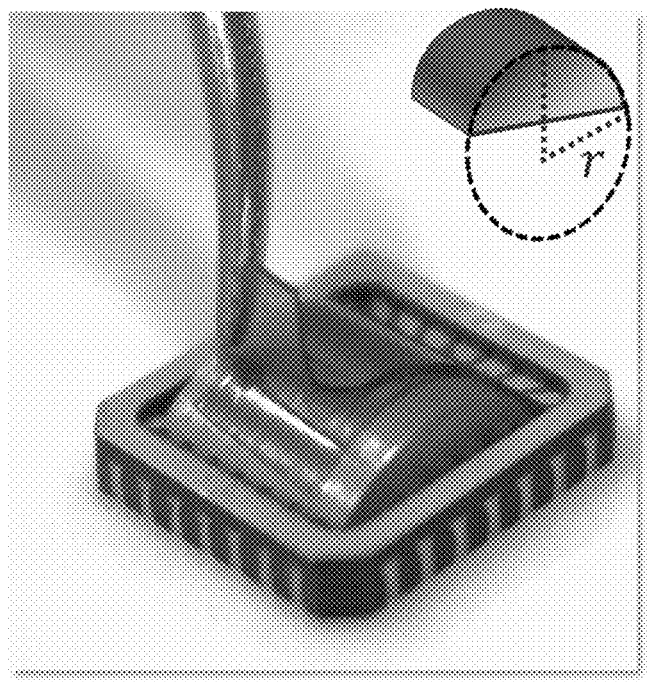
FIG. 2 is an image representing an amorphous-alloy SQUID on flexible and transferrable adhesive polyamide tape that is placed on a sample holder with r=11.2 mm. Insert: schematic representation of the radius of curvature of the bent holder.

In some embodiments, the article is a quantum device. In some embodiments, the quantum device is in form of a Josephson Junction (JJ), a weak link or a tunneling junction, as represented by FIG. 1. In some embodiments, JJ is characterized by a tunneling current. In some embodiments, JJ is characterized by a critical current. In some embodiments, JJ provides a region having a weakened superconductivity, (e.g. such that the JJ is characterized by non-classical current-voltage or current-phase relationship).

Critical current (Ic) is defined as a maximum current which can flow through a superconducting material or through a JJ. If the current exceeds the value of Ic, JJ is transferred from a superconducting to a normal conducting to state. The value of Ic is material dependent and is further specific to any particular configuration of the junction.

In some embodiments, JJ has a dimension (e.g. width, thickness of one or more layers) in a range from 0.1 nm to 1 um. In some embodiments, JJ comprises one or more superconductor layers bound to one or more insulating layers of a high dielectric material, wherein the dielectric material is as described hereinabove. In some embodiments, JJ comprises one or more superconductor layers bound to one or more layers comprising any of: a ferroelectric material, a ferromagnetic material or a combination thereof. In some embodiments, JJ comprises one or more insulating layers of a high dielectric material sandwiched by superconductor layers (also referred to herein as a trilayer JJ), wherein one or more insulating layers are in contact with superconductor layers. In some embodiments, JJ comprises an alternating configuration of layers (e.g. one or more superconductor layers, and one or more high dielectric material layers, having a subsequent or a random order of layers).

In some embodiments, the quantum device comprises a plurality of JJs. In some embodiments, the quantum device comprises a plurality of JJs connected in parallel, as exemplified by FIGS. 3 C, D.

In some embodiments, JJ comprises an elastic composition. In some embodiments, JJ comprises an elastic hybrid composition, wherein the elastic hybrid composition is as described hereinabove.

Figure 3A:
FIGS. 3A-D show exemplary configurations of polarization-induced field-effect hybrid devices.
Figure 3B:
Figure 3C:
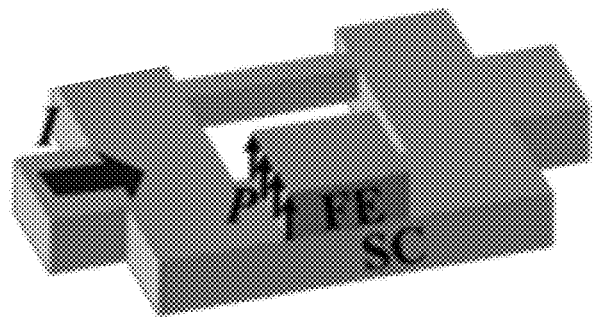
Figure 3D:
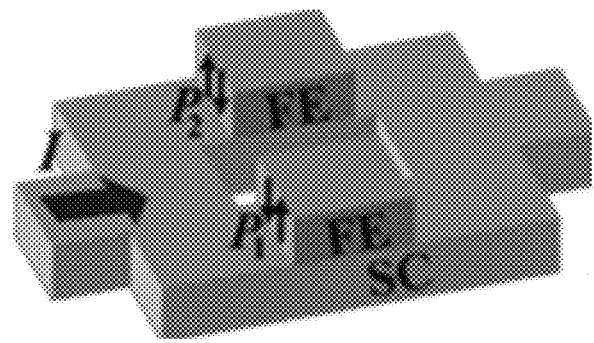
Figure 4:
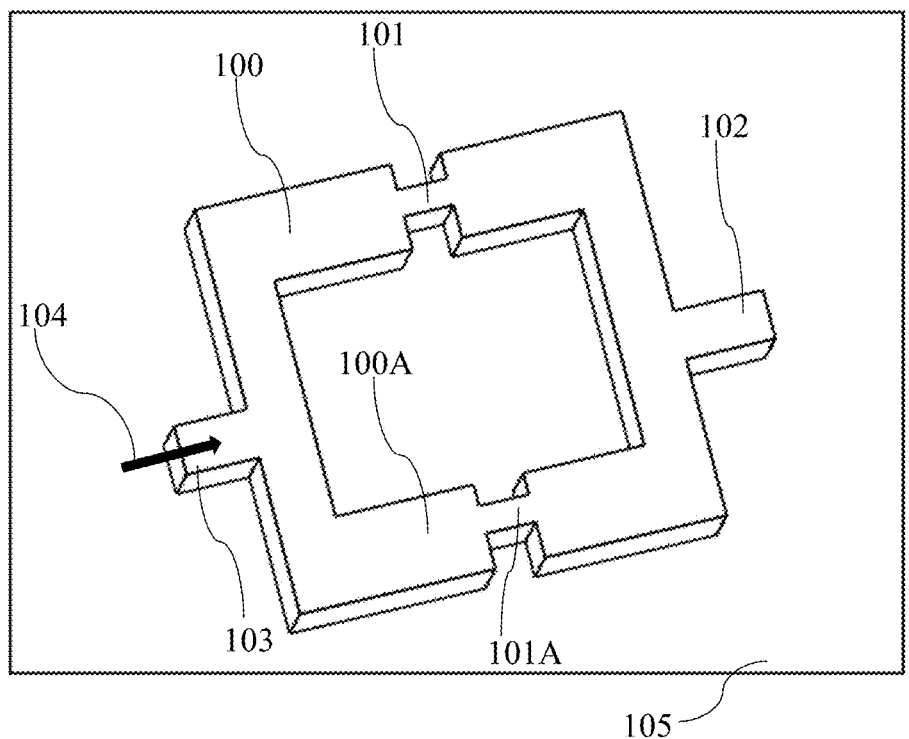
FIG. 4 is an illustration representing a non-limiting configuration of an exemplary device of the invention.

In some embodiments, JJ is configured according to a scheme as exemplified by FIGS. 1, 3, and 4).

In some embodiments, JJ comprises two or more superconductor electrodes interconnected by a link, wherein the superconductor electrodes are optionally bound to a substrate (FIG. 1). In some embodiments, JJ comprises two or more superconductor electrodes interconnected by a link, wherein the link comprises a superconductor. In some embodiments, JJ comprises two or more electrodes comprising an amorphous superconductor, wherein two or more electrodes are interconnected by at least one link. In some embodiments, at least one link comprises an amorphous superconductor.

In some embodiments, a width of the link is in a range from 3 to 5 times the three times the coherence length ($\xi$) of the adjacent superconductor electrodes. In some embodiments, a width of the link is about 4 times $\xi$. In some embodiments, a width of the link is less than 4 times $\xi$.

As used herein, the coherence length ($\xi$) of a superconductor can be regarded as the "size" of: a Cooper pair, or a vortex-anti vortex pair and can characterize the shortest distance over which superconductivity can be established in a material. The value of the coherence length is material specific.

In some embodiments, the link comprises a superconductor material that is different from the superconductor material used for fabrication of superconductor electrodes. In some embodiments, the link comprises a high dielectric material. In some embodiments, the link comprises the hybrid composition of the invention.

In some embodiments, JJ has an average thickness in a range from 1 to 10 atomic layers (a.l.), from 1 to 5 a.l., from 1 to 3 a.l., from 3 to 5 a.l., from 5 to 7 a.l., from 7 to 10 a.l., including any range therebetween.

In some embodiments, JJ has an average thickness in a range from 0.1 nm to 10 um, from 0.1 nm to 0.5 nm, from 0.5 nm to 1 nm, from 1 nm to 5 nm, from 5 nm to 10 nm, from 10 nm to 20 nm, from 20 nm to 30 nm, from 30 nm to 50 nm, from 50 nm to 100 nm, from 100 nm to 200 nm, from 200 nm to 300 nm, from 300 nm to 500 nm, from 500 nm to 1 um, from 1 um to 5 um, from 5 um to 10 um, including any range therebetween.

In some embodiments, JJ comprises a superconductor layer bound to an insulating layer. In some embodiments, JJ comprises a superconductor layer in contact with a layer of the high dielectric material (also referred to herein as a bilayer JJ), wherein the high dielectric material is the ferroelectric material or a ferromagnetic material.

In some embodiments, a bilayer JJ is characterized by variable superconductivity. In some embodiments, the superconductivity of the bilayer JJ is controllable. In some embodiments, a bilayer JJ is characterized by variability of the current flow (I) within the junction. In some embodiments, a bilayer JJ is characterized by variability of I within the superconductor material. In some embodiments, the value of I is controlled by applying an external electric field to the bilayer JJ. In some embodiments, the value of I is controlled by applying a magnetic field to the bilayer JJ. In some embodiments, I is reduced or enhanced by applying an external electric field to the ferroelectric material. In some embodiments, I is reduced or enhanced by applying voltage to the ferroelectric material.

In some embodiments, Ic value is modulated by applying current to the ferroelectric material. In some embodiments, Ic value is reduced or enhanced by applying current to the ferroelectric material.

In some embodiments, a physical property of the JJ is modulated by applying current to the ferroelectric material. In some embodiments, a physical property is selected from: a critical temperature, a critical magnetic field, coherence length, and concentration of superconducting charge carriers (e.g. cooper pairs, vortices). In some embodiments, the physical property comprises a tunneling behavior of the JJ, such as superconducting phase, amplitude and energy gap of the charge carriers.

In some embodiments, the ferroelectric material is polarized upon application of an external electric field. In some embodiments, polarization of the ferroelectric material generates an electric field on a surface of the ferroelectric material. In some embodiments, polarization of the ferroelectric material generates an electric field within of the ferroelectric material.

In some embodiments, polarized ferroelectric material being in contact with the superconductor material modulates superconductive properties of the superconductor material (e.g. a critical current density, a critical temperature, a critical magnetic field, coherence length, and concentration of superconducting charge carriers, such as: cooper pairs, vortices). In some embodiments, polarized ferroelectric material being in contact with the superconductor material modulates a tunneling behavior within the bilayer JJ.

In some embodiments, a plurality of bilayer JJs are connected in parallel, so as to form a binary device (FIGS. 3 C, D).

In the case of a trilayer JJ, the ferroelectric material is sandwiched between two superconducting element, so that the supercurrent tunnels through the ferroelectric material (FIG. 4). The dielectric properties (i.e. a tunneling barrier, polarization) of the ferroelectric material within the trilayer JJ are modulated by applying current, thereby inducing polarization of the ferroelectric material. However, the current that flows via the ferroelectric material depends on the tunneling barrier, which in turn depends on the polarization of the ferroelectric material. Therefore, the tunneling current can be controlled by modulating the polarization of the ferroelectric material.

In some embodiments, the trilayer JJ is characterized by variable tunneling behavior. In some embodiments, the trilayer JJ is characterized by variable tunneling barrier of the insulating layer. In some embodiments, the tunneling current of the trilayer JJ is modulated by providing a supercurrent to the trilayer JJ.

In some embodiments, the polarization of the trilayer JJ is modulated by applying an electric field to the trilayer JJ.

In some embodiments, a quantum state (e.g. a superconducting state or a normal conducting state) of the trilayer JJ is controllable. In some embodiments, the trilayer JJ is transferred form a normal conducting state to a superconducting state by applying supercurrent. In some embodiments, a quantum state of the trilayer JJ is predetermined by an input current. In some embodiments, the quantum state of the trilayer JJ is controllable by modulating the input current of the trilayer JJ, as represented by FIG. 6. In some embodiments, the trilayer JJ is characterized by a hysteretic behavior (FIG. 7).

In some embodiments, the tunneling behavior (e.g. wave function phase, wave function amplitude) of the JJ is controllable by modifying the geometric shape thereof.

Figure 9:
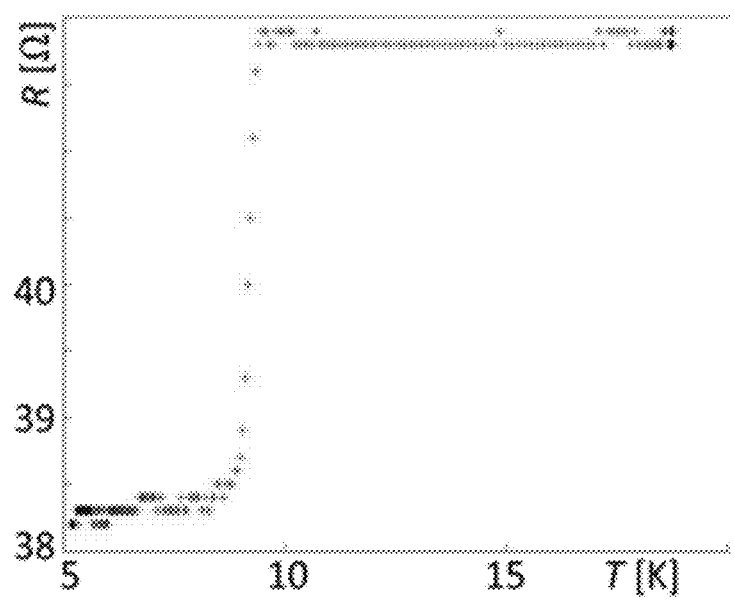
FIG. 9 is a graph showing temperature dependent resistivity of thin superconducting niobium nitride (NbN) film on PZT. Cooling curve of a thin NbN superconducting layer that was grown on a thin PZT ferroelectric layer shows a superconductive behavior, with critical temperature above 9K (2-terminal measurement).

In some embodiments, the article comprises a quantum device. In some embodiments, the quantum device is a superconducting quantum device (SQUID). Exemplary configurations of various SQIUDs are represented by FIGS. 9-10.

Figure 5:
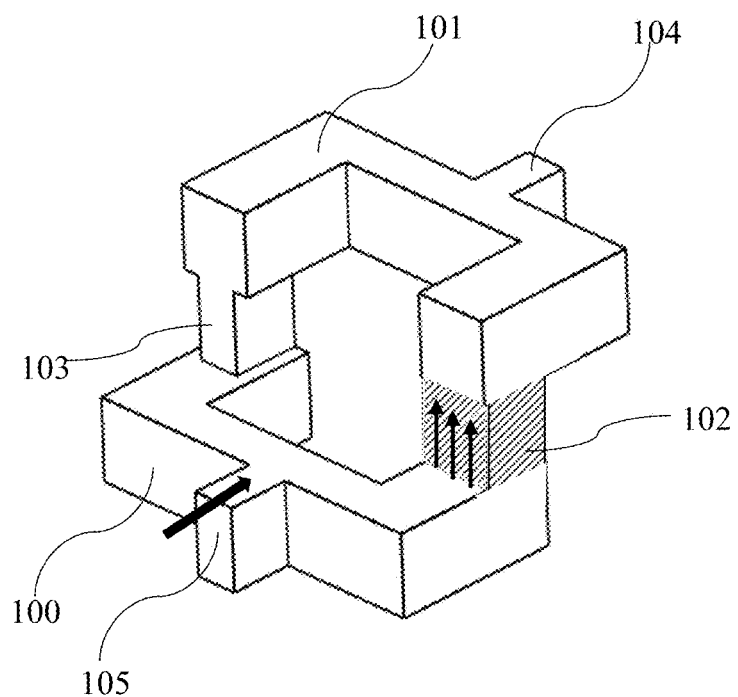
FIG. 5 is an illustration representing a non-limiting configuration of an exemplary polarization-sensitive tunneling hybrid device of the invention.

In some embodiments, SQIUD comprises a JJ. In some embodiments, SQIUD comprises a plurality of JJs. In some embodiments, two or more JJs are connected in parallel (FIGS. 4 B, C, and FIG. 5 C).

In some embodiments, SQIUD is further in contact with a substrate, wherein the substrate is as described hereinabove.

In some embodiments, SQIUD has a dimension parameter ranging from 1 nm to 1 cm, wherein the dimension comprises: a width, a length or both.

In some embodiments, the article is characterized by controllable quantum state. In some embodiments, the article is transferred from a superconducting to a normal conducting state or vice versa by applying a magnetic field.

In some embodiments, the resistance of SQIUD in the normal conducting state is modulated by applying a magnetic field.

In some embodiments, SQIUD is characterized by controllable physical value, wherein the physical value is selected from the group consisting of: a tunneling behavior, a critical magnetic field, a critical current, a critical temperature, superconducting current, photoresistance, and magnetic inductance or any combination thereof. In some embodiments, the physical value of SQUID is controlled by applying current to the ferroelectric material of the JJ.

Reference is now made to FIG. 4 showing an exemplary device (e.g. SQUID) according to some embodiments of the invention. The device may have an electrode 100 and optionally an additional electrode 100A. The electrodes 100 and 100A are in electrical communication, so as to form an electrical circuit. The electrodes 100 and 100A are composed of a superconductor material, as described herein. In some embodiments, each of the electrodes 100 and 100A comprises different superconductor materials. The electrodes 100 and 100A may be in form of a layer. The layer may have a thickness of between 0.1 and 1 mm, of between 1 and 50 nm, of between 5 and 30 nm, between 10 and 30 nm, between 50 and 100 nm, between 100 and 500 nm, between 500 and 1000 nm, between 1 and 1000 um, between 1 and 100 um, between 100 and 500 um, between 500 and 1000 um, including any range therebetween. The layer may have a thickness sufficient for stabilizing the amorphous state of the superconductor (e.g. substantially preventing formation of a crystal lattice).

The device may have one or more links (101 and/or 101A) or JJs. The links or JJs (101 and 101A) are electrically coupled to each other. The links or JJs (101 and 101A) may be connected to each other in parallel. In some embodiments, the link or JJ is as described herein. In some embodiments, each of the one or more JJ may comprise one or more amorphous superconductor material, wherein the amorphous superconductor material is as described herein. In some embodiments, the electrodes 100 and 100A and links (101 and/or 101A) are composed of the same material. In some embodiments, each of the one or more JJ may comprise a hybrid composition of the invention. In some embodiments, the link is in a form of a layer.

In some embodiments, the link comprises a superconductor material, wherein the thickness of the link is as described for the electrodes 100 and 100A. In some embodiments, the link has a dimension as described hereinabove. In some embodiments, the link has a width and/or thickness configured to provide a tunneling current. In some embodiments, the link comprises a superconductor material, wherein at least one dimension (e.g. width and/or thickness) of the link is less than 10 times, less than 9 times, less than 8 times, less than 7 times, less than 6 times, less than 5 times, less than 4 times, less than 3 times, less than 2.5 times, less than 2 times, less than 1.5 times greater than the coherence length of the superconductor material of the electrodes 100 and 100A.

The device may have a first end 103 and a second end 104. The first end 103 and the second end 104 may be in operable communication with a current source. The current source may be a direct current source (DC) or an alternating current source (AC). The current direction may be as represented by arrow 104.

The device may be in contact with, bound, or adhered to a substrate 105. The substrate 105 may be in a form of a substrate layer, as described hereinabove. The substrate 105 may be an elastic substrate or a deformable substrate, as described hereinabove. The device may be characterized by a first planar configuration and by a second folded or curved configuration. The device may be characterized by a first planar configuration and by a second partially folded or partially curved configuration. The device may be at least partially curved. The device may be capable of undergoing deformation, so as to provide the device from a first planar configuration into a second folded or curved configuration, or vice versa. The shape (e.g. the curvature) of the device may be controllable.

In some embodiments, SQIUD is characterized by a controllable superconducting property.

In some embodiments, the apparatus of the invention (e.g. SQIUD) is characterized by controllable physical property, wherein physical property or physical value is controllable by modifying (e.g. increasing) the curvature of the apparatus. In some embodiments, controllable comprises modifying (e.g. increasing or decreasing) one or more physical value (e.g. interference periodicity) of the apparatus compared to a control by at least 2 times, at least 3 times, at least 4 times, at least 5 times, at least 6 times, at least 10 times, at least 12 times, at least 15 times, at least 20 times, including any range therebetween. In some embodiments, the physical value is controllable by providing the apparatus into the second curved configuration (e.g. partially curved configuration). In some embodiments, the control comprises the apparatus of the invention (e.g. SQIUD) being in the first planar configuration.

Figure 14:
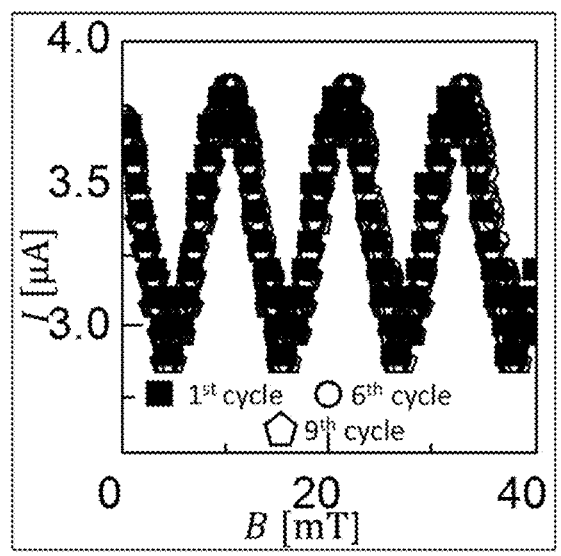
FIG. 14 is a graph representing repeatability and reproducibility of SQUID behavior under variable flexure conditions. Repeatability of interference periodicity was observed up to 20 cycles.

In some embodiments, the one or more physical value of the apparatus is controllable by folding (e.g. increasing the curvature) the apparatus, wherein the one or more physical value is as described herein. In some embodiments, the one or more physical value of the apparatus is controllable by folding (e.g. increasing the curvature) the apparatus. In some embodiments, the one or more physical value of the apparatus is controllable by providing the apparatus from the first planar configuration into a second folded or curved configuration. In some embodiments, controllable comprises increasing or decreasing one or more physical value of the apparatus by at least 5%, at least 7%, at least 10%, at least 15%, at least 20%, at least 30%, at least 40%, at least 50%, at least 70%, at least 100%, compared to the control including any range therebetween. In some embodiments, the apparatus (e.g. SQUID) retains the one or more physical value upon repeated bending and relaxation cycles (see FIG. 14). In some embodiments, the apparatus (e.g. SQUID) retains the one or more physical value after at least 2, at least 4, at least 6, at least 8, at least 10, at least 15, at least 20, at least 30 bending cycles including any range or value therebetween.

As exemplified herein, (see FIG. 13), the periodicity of the interference pattern of various SQUIDs composed of amorphous superconductors (such as MoSi and WSi) decreases (up to 12 fold decrease) upon providing the SQUID from a planar state into a curved state. As demonstrated by Table 1 and by FIG. 13, periodicity decreases with increasing curvature of the SQUID. As exemplified herein (Tables 2 and 3), additional superconductive properties (e.g. critical temperature, critical current, critical magnetic field and coherence length) of the SQUID of the invention are controllable by increasing the curvature of the SQUID.

In some embodiments, SQIUD further comprises an elastic substrate. In some embodiments, SQIUD is in contact with an elastic substrate. In some embodiments, SQIUD is manufactured on an elastic substrate (also referred to herein as a flexible SQUID). In some embodiments, the physical value of the flexible SQIUD is dependent on a geometric shape thereof. In some embodiments, the physical value of the flexible SQIUD is controllable by modifying the geometric shape thereof. In some embodiments, operation of the article (e.g. the flexible SQIUD or a flexible quantum computing device) is controllable by modifying the geometric shape thereof.

In some embodiments, the geometric shape is a planar shape or a non-planar shape or any combination thereof. In some embodiments, the flexible SQUID has a bent shape.

In some embodiments, the geometric shape of the flexible SQIUD is variable, so as the flexible SQIUD can obtain either a planar or a non-planar shape interchangeably.

In some embodiments, the flexible SQIUD is characterized by controllable sensitivity to a magnetic field.

In some embodiments, the quantum state of the flexible SQUID is controllable by modifying the geometric shape of the SQUID.

In some embodiments, the sensitivity of the flexible SQUID to a magnetic field is controllable by modifying the polarization of the ferroelectric material. In some embodiments, the sensitivity of the flexible SQUID to a magnetic field is controllable by applying an electric field to the ferroelectric material. In some embodiments, controllable is as described herein.

Reference is now made to FIG. 5 representing an exemplary device (e.g. SQUID) according to some embodiments of the invention. The device may have an electrode 100 and an additional electrode 101. The electrodes 100 and 101 are in electrical communication, so as to form an electrical circuit. The electrodes 100 and 101 are composed of a superconductor material (e.g. amorphous superconductor and/or crystalline superconductor), as described herein. In some embodiments, each of the electrodes 100 and 101 comprises the same or different superconductor materials. The electrodes 100 and 101 may be in form of a layer. The electrodes 100 and 101 may be in form of plurality of layers. The electrode 101 may be position on top of the electrode 100.

One or more layers of superconductor material (e.g. forming the electrodes 100 and 101) may have a thickness of between 0.1 and 1 mm, of between 1 and 50 nm, of between 5 and 30 nm, between 10 and 30 nm, between 50 and 100 nm, between 100 and 500 nm, between 500 and 1000 nm, between 1 and 1000 um, between 1 and 100 um, between 100 and 500 um, between 500 and 1000 um, including any range therebetween. The layer may have a thickness sufficient for stabilizing the amorphous state of the superconductor (e.g. substantially preventing formation of a crystal lattice).

The device may have a thickness of between 0.1 and 1 mm, of between 1 and 50 nm, of between 5 and 30 nm, between 10 and 30 nm, between 50 and 100 nm, between 100 and 500 nm, between 500 and 1000 nm, between 1 and 1000 um, between 1 and 100 um, between 100 and 500 um, between 500 and 1000 um, including any range therebetween.

The superconductor layer may have a thickness sufficient for stabilizing the amorphous state of the superconductor (e.g. substantially preventing formation of a crystal lattice, so that the thickness of the amorphous superconductor layer is up to 100 um). Wherein, a crystalline superconductor is implemented for the formation of the electrodes 100 and 101, the thickness of the superconductor layer is up to several millimeters. In some embodiments, the thickness of the crystalline superconductor layer is limited by deformability or flexibility of the resulting device and/or of the crystalline superconductor layer.

The device may have one or more links (102 and/or 103) or JJs. The links or JJs (102 and 103) are in electrical communication with each other. The links or JJs (102 and 103) may be electrically connected to each other in parallel. The link or JJ is as described herein. JJ 103 may comprise one or more superconductor material, wherein the superconductor material is as described herein. JJ 103 may comprise one or more amorphous superconductor material. JJ 103 may have at least one dimension being less than 10 times, less than 9 times, less than 8 times, less than 7 times, less than 6 times, less than 5 times, less than 4 times, less than 3 times, less than 2.5 times, less than 2 times, less than 1.5 times greater than the coherence length of the superconductor material of the electrodes 100 and 101.

In some embodiments, the electrodes 100 and 101 and JJ 103 are composed of the same superconductor material. In some embodiments, each of the one or more JJs 102 and 103 may comprise a hybrid composition of the invention. In some embodiments, the link is in a form of a layer. In some embodiments, the link is in a form of a plurality of layers.

The JJ 102 may comprise one or more amorphous superconductor material, wherein the amorphous superconductor material is as described herein. JJ 102 may comprise a hybrid composition of the invention. JJ 102 may comprise a first layer comprising the superconductor material of any of the electrodes 100 and 101 and a second layer comprising a high dielectric material of the invention. JJ 102 may comprise a third layer. In some embodiments, the first layer and the third layer are identical.

In some embodiments, any one of the links 102 and 103 is characterized by the thickness as described for the electrodes 100 and 101. In some embodiments, any one of the links 102 and 103 has a dimension as described hereinabove.

In some embodiments, the link 103 has a width configured to provide a tunneling current, as described herein. In some embodiments, the link 102 has the same width as the electrodes 100 and 101. In some embodiments, the links 102 and 103 are configured to establish tunneling current. In some embodiments, the tunneling current is directed along a vertical axis of any one of the links 102 and 103 (depicted by parallel arrows).

The device may have a first end 105 and a second end 104. The first end 105 and the second end 104 may be in operable communication with a current source. The current source may be a direct current source (DC) or an alternating current source (AC). The current direction may be as represented by arrow.

Figure 6A:
FIGS. 6A-C are illustrations representing non-limiting configurations of three-terminal superconducting switching device of the invention.
Figure 6B:
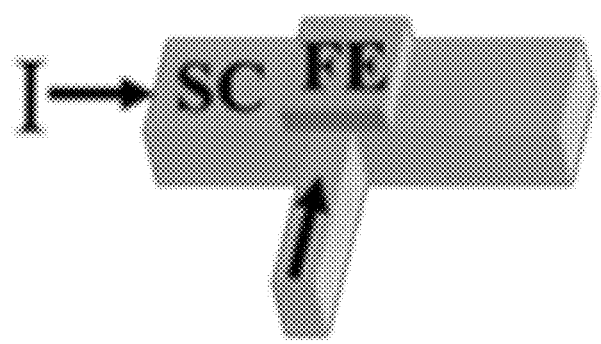
Figure 6C:
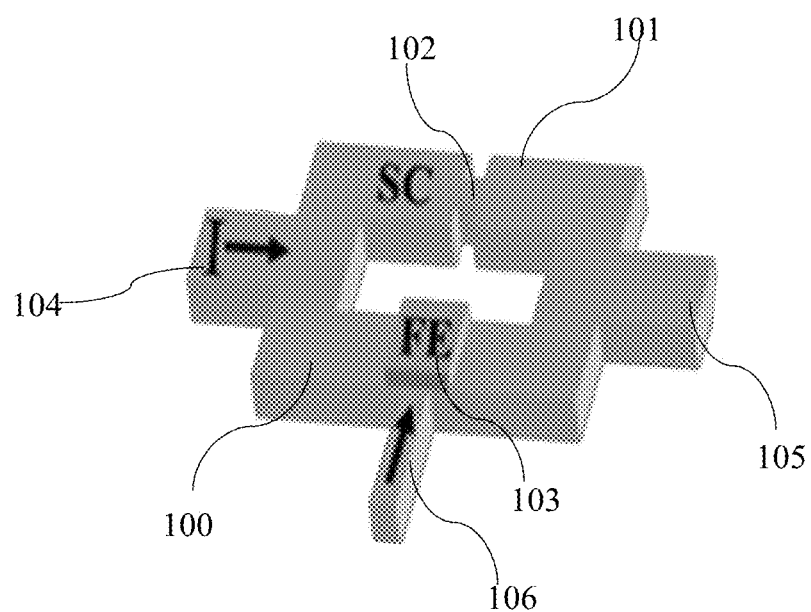
Figure 7A:
FIGS. 7A-F are graphs showing response of a sandwiched superconducting-ferroelectric (FE)-superconducting junction. The x-axis is time (seconds) and the y-axis is current.
Figure 7B:
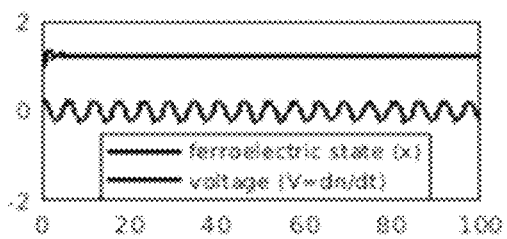
Figure 7C:
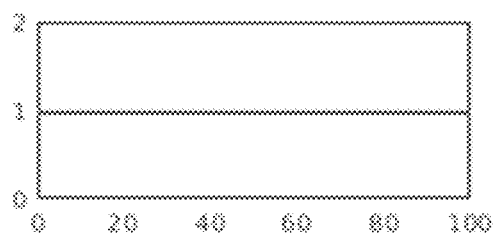
Figure 7D:
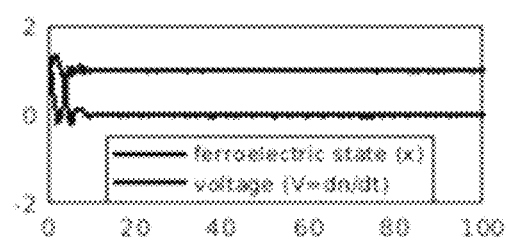
Figure 7E:
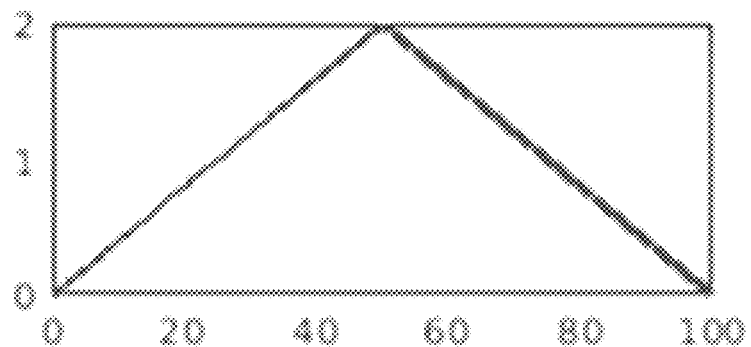
Figure 7F:
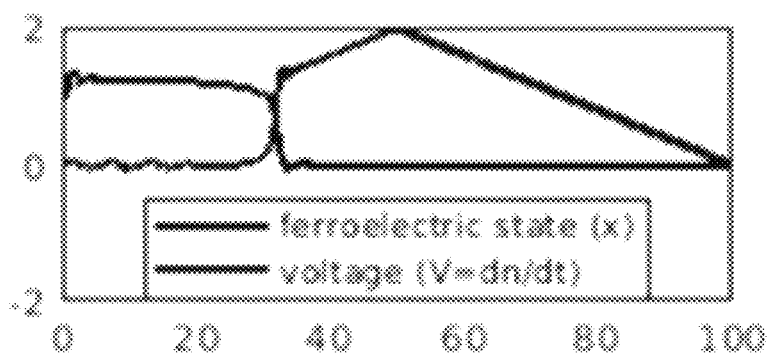

Reference is now made to FIG. 6C representing an exemplary device (e.g. SQUID) according to some embodiments of the invention. The device may have an electrode 100 and an additional electrode 101. The electrodes 100 and 101 are in electrical communication, so as to form an electrical circuit. The electrodes 100 and 101 are composed of a superconductor material (e.g. amorphous and/or crystalline superconductor), as described herein. In some embodiments, each of the electrodes 100 and 101 comprises the same or different superconductor materials. The electrodes 100 and 101 may be in form of a layer. The electrodes 100 and 101 may be in form of plurality of layers.

One or more layers of superconductor material (e.g. forming the electrodes 100 and 101) may have a thickness of between 0.1 and 1 mm, of between 1 and 50 nm, of between 5 and 30 nm, between 10 and 30 nm, between 50 and 100 nm, between 100 and 500 nm, between 500 and 1000 nm, between 1 and 1000 um, between 1 and 100 um, between 100 and 500 um, between 500 and 1000 um, including any range therebetween. The layer may have a thickness sufficient for stabilizing the amorphous state of the superconductor (e.g. substantially preventing formation of a crystal lattice, so that the thickness of the amorphous superconductor layer is up to 100 um). Wherein, a crystalline superconductor is implemented for the formation of the electrodes 100 and 101, the thickness of the superconductor layer is up to several millimeters. In some embodiments, the thickness of the crystalline superconductor layer is limited by deformability or flexibility of the resulting device and/or of the crystalline superconductor layer.

The device may have a thickness of between 0.1 and 1 mm, of between 1 and 50 nm, of between 5 and 30 nm, between 10 and 30 nm, between 50 and 100 nm, between 100 and 500 nm, between 500 and 1000 nm, between 1 and 1000 um, between 1 and 100 um, between 100 and 500 um, between 500 and 1000 um, including any range therebetween.

The device may have one or more links (102 and/or 103) or JJs. The links or JJs (102 and 103) are in electrical communication with each other. The links or JJs (102 and 103) may be electrically connected to each other in parallel. The link or JJ is as described herein.

JJ 102 may comprise one or more superconductor material (e.g. amorphous and/or crystalline), wherein the superconductor material is as described herein. JJ 102 may comprise one or more amorphous superconductor material. JJ 102 may comprise one or more c. JJ 102 may have at least one dimension being less than 10 times, less than 9 times, less than 8 times, less than 7 times, less than 6 times, less than 5 times, less than 4 times, less than 3 times, less than 2.5 times, less than 2 times, less than 1.5 times greater than the coherence length of the superconductor material of the electrodes 100 and 101.

In some embodiments, the electrodes 100 and 101 and JJ 103 are composed of the same superconductor material. In some embodiments, each of the one or more JJs 102 and 103 may comprise a hybrid composition of the invention. In some embodiments, the link is in a form of a layer. In some embodiments, the link is in a form of a plurality of layers.

The JJ 103 may comprise one or more amorphous superconductor material, wherein the amorphous superconductor material is as described herein. The JJ 103 may comprise one or more crystalline superconductor material. JJ 103 may comprise a hybrid composition of the invention. JJ 103 may comprise a first layer comprising the superconductor material of any of the electrodes 100 and 101 and a second layer comprising a high dielectric material of the invention. JJ 103 may comprise a third layer bound to and on top of the second layer. In some embodiments, the third layer comprises an electrode.

JJ 103 may be configured as exemplified by FIG. 6A or by FIG. 6B.

JJ 103 may comprise a gate electrode 106 in electrical communication with the electrode 100. The gate electrode 106 may be in close proximity or in contact with the electrode 100. The gate electrode 106, and the hybrid composition optionally composing the JJ 103 may be in electrical communication with each other. The gate electrode 106, may be configured to provide a gate current to the JJ 103. JJ 103 may be in a form of a three-terminal junction.

In some embodiments, the device comprising a three-terminal JJ 103 is configured to provide tunability to the phase and amplitude of the wavefunction, as described herein.

In some embodiments, any one of the links 102 and 103 is characterized by the thickness as described for the electrodes 100 and 101. In some embodiments, any one of the links 102 and 103 has a dimension as described hereinabove.

In some embodiments, the link 102 has a width configured to provide a tunneling current, as described herein. In some embodiments, the link 103 has the same width as the electrodes 100 and 101. In some embodiments, the links 102 and 103 are configured to establish tunneling current.

The device may have a first end 105 and a second end 104. The first end 105, the second end 104 and the gate electrode 106 may be in operable communication with a current source, wherein the current source may be the same or different. The first end 105 and the second end 104 may be in operable communication with a first current source, and the gate electrode 106 may be in operable communication with a second current source. The current source may be a direct current source (DC) or an alternating current source (AC). The current direction may be as represented by arrow.

The device may be in contact with, bound, or adhered to a substrate. The substrate may be in a form of a substrate layer, as described hereinabove. The substrate may be an elastic substrate or a deformable substrate, as described hereinabove. The device may be characterized by a first planar configuration and by a second folded or curved configuration. The device may be characterized by a first planar configuration and by a second partially folded or partially curved configuration. The device may be at least partially curved. The device may be capable of undergoing deformation, so as to provide the device from a first planar configuration into a second folded or curved configuration, or vice versa. The shape (e.g. the curvature) of the device may be controllable.

In some embodiments, SQUID (e.g. as exemplified by FIGS. 3, 5 and 6) comprising a hybrid composition of the invention is characterized by tunability of one or more physical values (e.g. transition temperature, critical current) wherein tunability is by applying current to the high dielectric substrate (e.g. ferroelectric substrate). In some embodiments, by applying current to the ferroelectric substrate, the critical current of the SQUID is reduced by at least 5%, at least 7%, at least 10%, at least 15%, at least 20%, at least 30%, at least 40%, at least 50%, at least 70%, at least 100%, compared to the control including any range therebetween. In some embodiments, by applying current to the ferroelectric substrate, transition temperature of the SQUID is reduced by at least 5%, at least 7%, at least 10%, at least 15%, at least 20%, at least 30%, at least 40%, at least 50%, at least 70%, at least 100%, compared to the control including any range therebetween. In some embodiments, control is the same SQUID, without applying a current to the ferroelectric substrate.

In some embodiments, the hybrid composition comprises a bottom support layer (e.g. $DyScO_3$, or $SrTiO_3$), a second electrode layer (e.g. $SrRuO_3$) on top and bound to the bottom support layer, a third high dielectric layer (e.g. PZT) on top and bound to the second electrode layer, and a superconductor layer (e.g. MoSi) on top and bound to the third high dielectric layer.

In some embodiments, SQUID is configured to detect any of: a magnetic field, a photon, and a thermal energy or any combination thereof.

In some embodiments, the article is in form of: a power-efficient computing device, a power-efficient data storage device, a quantum computing device (e.g. quantum memory, quantum bit or both), a light detector (e.g. a superconducting wire single photon detector (SSPD)), bolometer (e.g. transition edge sensor), or a kinetic-inductance device.

In some embodiments, the article comprising a flexible composition of the invention (e.g. amorphous composition or hybrid composition) is in form of a superconducting magnetic coil. In some embodiments, the article is in a form of a spiral. In some embodiments, the article is in a form of a circle. In some embodiments, the magnetic field strength and/or direction is tunable by changing the curvature of the coil. In some embodiments, the article in form of a superconducting magnetic coil has a dimension (e.g. thickness, width, length) being appropriate for the formation of a magnetic field. Such appropriate dimensions are well-known to a person skilled in the art.

Figure 17:
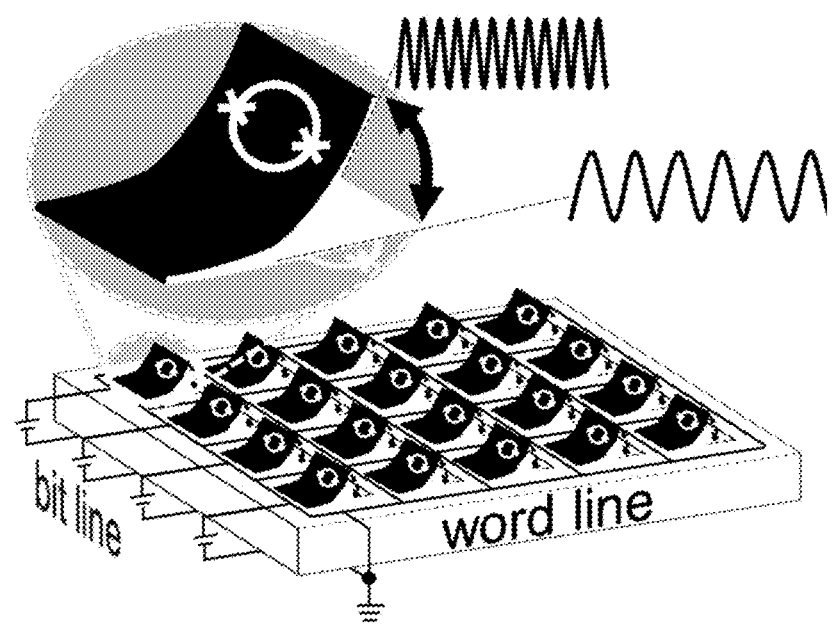
FIG. 17 is a schematic illustration of a device comprising superconductive quantum devices that are placed on ferroelectric/piezoelectric substrate and are controlled individually.
Figure 18:
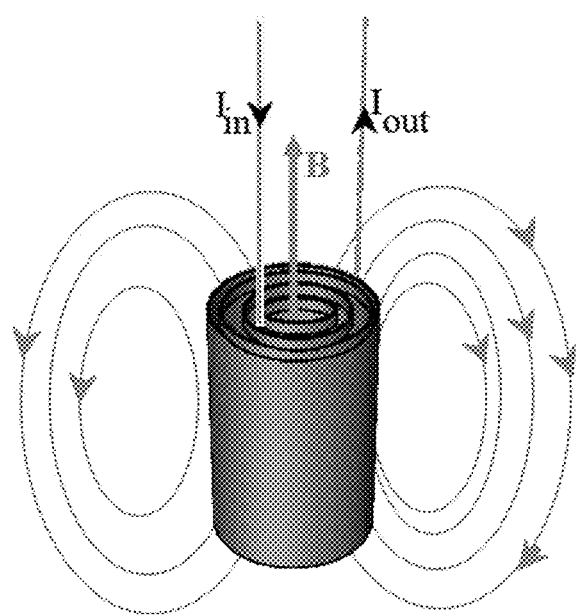
FIG. 18 is a schematic illustration of magnetic coils formed by utilizing a flexible (amorphous) superconductive composition of the invention.

In some embodiments, the article is in form of a memory device, comprising a plurality of SQUIDS, wherein at least one physical value (e.g. interference periodicity) of each of the plurality of SQUIDS is independently controllable by modifying a curvature thereof. In some embodiments, at least a part of the plurality of SQUIDS comprises a JJ comprising a hybrid composition of the invention. In some embodiments, the plurality of SQUIDS within the article are in operable communication with a control unit. In some embodiments, the plurality of SQUIDS are in operable communication with each other. An exemplary memory device is represented by FIG. 17.

In some embodiments, the article is used for any of: a classical and/or quantum communication, computation, data storage, encryption, metrology, spectroscopy, and nuclear engineering and monitoring or any combination thereof.

Manufacturing Methods

In another aspect of the invention, there is provided a method of manufacturing the composition of the invention. In some embodiments, the method is for manufacturing one or more layers of the superconductor material bound to a substrate. In some embodiments, the method is for manufacturing the amorphous composition, wherein the amorphous composition is as described hereinabove. In some embodiments, the method is for manufacturing the hybrid composition, wherein the hybrid composition is as described hereinabove.

In some embodiments, the method is for manufacturing one or more layers of the superconductor material bound to a substrate.

In some embodiments, the method is selected from the group consisting of: sputtering process, chemical vapor deposition (CVD), physical vapor deposition (PVD), atomic layer deposition techniques (ALD), pulsed laser deposition (PLD), molecular beam epitaxy (MBE), sol-gel, thermal amorphization, and film exfoliation, or any combination thereof. In some embodiments, one or more layers have a thickness less than a coherence length of the superconductor material. In some embodiments, one or more layers have a thickness less than 10 times the coherence length of the superconductor material.

In some embodiments, the method comprises sputtering process.

In some embodiments, the method of manufacturing a superconductor layer bound to substrate by sputtering, comprises the steps of:
  a. introducing a substrate into an ambient of reduced pressure, wherein the substrate is under controlled temperature;
  b. providing a target under conditions sufficient for sputtering, wherein the target comprises one or more elements selected from the group consisting of: tungsten (W), molybdenum (Mo), titanium (Ti), tantalum (Ta), niobium (Nb), nickel (Ni), cobalt (Co), zirconium (Zr), lanthanum (La), germanium (Ge), gallium (Ga), lead (Pb), beryllium (Be), zinc (Zn), ruthenium (Ru), rhodium (Rh), bismuth (Bi), indium (In), tin (Sn), palladium (Pd), gold (Au), osmium (Os), iridium (Ir), nitrogen (N), oxygen (O) and silicon (Si) or any combination thereof;
  c. sputtering one or more elements on the substrate, thereby manufacturing the superconductor layer on the substrate.

In some embodiments, the superconductor layer is an amorphous layer.

In some embodiments, the method further comprises repeating step (c), thereby manufacturing a second superconductor layer. In some embodiments, the method further comprises repeating step (c), thereby manufacturing a plurality of superconductor layers on the substrate. In some embodiments, the method further comprising repeating step (c) is for manufacturing a ferroelectric layer in contact with the superconductor layer.

In some embodiments, controlled temperature is less than 70° C.

In some embodiments, conditions sufficient for sputtering comprise applying vacuum. In some embodiments, conditions sufficient for sputtering comprise plasma irradiation of the target. In some embodiments, the method comprises irradiating a plurality of targets, wherein each target comprises independently an element selected from the group consisting of: a metal (e.g. W, Fe, Mo, Ti, Zn, Ni, Nb, Ge), and Si. In some embodiments, conditions sufficient for sputtering comprise applying a vacuum. In some embodiments, conditions sufficient for sputtering comprise a gas, such as $N_2$, O and Ar or a combination thereof.

In some embodiments, the method of manufacturing a high dielectric material layer by sputtering, comprises the steps (a) to (c), wherein the substrate is any of: a superconducting material, a ferromagnetic material, a polymeric material, a glass material, and a metallic material or a combination thereof. In some embodiments, the high dielectric material layer is as described hereinabove.

In some embodiments, the method of manufacturing a high dielectric material comprises a large crystal liquid preparation method, solid or liquid-solid preparation methods (e.g. zone melting, molding and Czochralski processes).

In some embodiments, the method further comprises manufacturing of a second layer. In some embodiments, the second layer comprises any of: a superconductor material, and a high dielectric material. In some embodiments, the second layer is an amorphous layer. In some embodiments, the second layer is disposed on the first layer. In some embodiments, the second layer comprising a superconductor material has a thickness less than a coherence length thereof.

In some embodiments, the fabricated hybrid composition including the first layer and the second layer can be removed from the substrate via etching. The removed hybrid superconductor can then be used to construct other superconducting devices. In another example, the fabricated hybrid superconductor can stay on the substrate (e.g. an elastic substrate) during subsequent manufacturing of devices such as a SQUID.

General

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed formulation, method or structure.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination. All combinations of the embodiments pertaining to the invention are specifically embraced by the present invention and are disclosed herein just as if each and every combination was individually and explicitly disclosed. In addition, all sub-combinations of the various embodiments and elements thereof are also specifically embraced by the present invention and are disclosed herein just as if each and every such sub-combination was individually and explicitly disclosed herein.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

Various embodiments and aspects of the present invention as delineated hereinabove and as claimed in the claims section below find experimental support in the following examples.

EXAMPLES

The basic superconductive quantum-device building block is a Josephson junction or a weak link. Such a structure exhibits absent or suppressed superconductivity, which is sandwiched between two superconductors, allowing Cooper-pair electrons to tunnel between them. A quantum state of a junction is characterized by a complex order parameter $\psi=\Delta e^{i\theta}$. Here, the amplitude ($\Delta$) sets the maximal superconducting current that can flow through the weak link as well as to the superconducting transition temperature (TC). $\Delta$ is thus measurable with a single junction. Contrariwise, the phase ($\theta$) cannot usually be measured directly in absolute values, but only phase differences are measurable. Therefore, typical quantum superconductive devices comprise two weak links that are connected in parallel, while the phase difference between them is periodic with external magnetic field, resulting in an interference pattern. The interference pattern in such superconducting quantum interference devices (SQUIDs) is obtained when the current at which the material switches from superconductor to normal metal (Is) oscillates as a function of applied magnetic flux density $B_{ext}=\Phi_{ext}/A$. Here, A is the device area and $\Phi_{ext}$ is the resulting flux that is perpendicular to the SQUID. The periodicity of this oscillation ($B_0$) is constant and corresponds to a single flux quantum ($\Phi_0 \equiv h/2e$, h is Planck's constant and e is the electron charge), while satisfying Equation (1): $\Phi_0=B_0 A$.

SQUIDs are used for magnetic sensors with high accuracy over a broad range of magnetic fields. Asymmetric SQUID structures that often comprise capacitors and inductors demonstrate high-frequency resonance that is the basis for superconducting quantum and low-power data processing. The resonance frequency is set by the constant periodicity ($\Phi_0$) of the dc SQUID. This periodicity also dictates the device magnetic-field sensitivity. Tuning the functional properties of a SQUID requires therefore adjustability of $\Delta$, $\theta$ or $\Phi_0$.

Materials and Methods

1. Film Deposition

Superconducting films were deposited using ATC2200 (AJA International inc. MA, USA) off-axis magnetron sputtering. Mo80Si20 and W60Si40 targets (99.95%) were purchased from AJA International. Sputtering conditions included 35W (0.27 Å sec-1 deposition rate), 3 mTorr and 50 sccm Ar flow (99.9999%), with 20-cm target-sample distance at 22° C. Film thickness was determined by using a five-oscillator fit (one Drude, one Tauc-Lorentz, one Gauss-Lorentz and two Gaussians) of varying-angle spectroscopy ellipsometry (VASE) measurements of the optical constants (M-2000 by J. A. Woollam, NE USA).

Substrates were purchased from commercial suppliers: intrinsic Si with 318 nm oxide layer (UniversityWafers Inc.); glass substrates (microscope slides by Corning® Inc., NY, USA); layered mica (Asylum Research by Oxford Instruments Ltd.); and polyimide (20-um width adhesive polyamide tape from Zhuhai Store, Gaungdong, China). Thirty nine chips were produced on silicon, on glass (non-flexible thick glass layer), on polyamide and two on mica for $\alpha Mo_{81}Si_{19}$ and $\alpha W_{60}Si_{40}$ films on polyamide, with a typical size of 5×5 mm$^2$.

2. Film Characterization

XRD profiling was done using θ-2θ with a Rigaku Smart-Lab 9-kW high-resolution diffractometer. A Cu kα rotating-anode source at 45 kV tube voltage was used, with a 150-mA tube current as well as with a 0 D silicon drift detector.

Stoichiometry analysis of the molybdenum silicide was done with a UHV (210-10 Torr) XPS (Versaprobe III-PHI Instrument, PHI, USA). Samples were irradiated with a focused X-ray Al Kα monochromated source (1486.6 eV, beam size 200 □ m, with 25 W and 15 kV). Outcoming photoelectrons were directed to a spherical capacitor analyzer (SCA). Sample charging was compensated by a dual-beam charge neutralization based on a combination of a traditional electron flood gun and a low energy argon ion beam.

Topography characterization was done with tapping-mode atomic force microscopy (MFP3D Asylum Research by Oxford Instruments Ltd.), using a silicon tip with 70-kHz resonance frequency and 2 N m-1 spring constant, while WSxM was used for presenting the data.

Tc and other critical values were determined by using the 90% drop from the normal resistance at 20 K, while the sheet resistance was measured with a 4-point probe station (Signatone Co., CA USA) connected to a Keithley 6220 multimeter (Keithley Instruments, Tektronix OH, USA). Typical Tc was measured as 6.7-7.2 K and 4-4.5 K with corresponding ~500Ω/□ [Ohm/square] and ~450Ω/□ sheet resistance for 15-nm molybdenum silicide and tungsten silicide films, respectively.

Device Fabrication

Devices (SQUIDs and nanowires) were fabricated by the electron-beam lithography method. PMMA 950 A3 electron-beam resist was applied by spin coating, followed by 2-min post baking. A thin layer of 'e-spacer' was used occasionally to avoid charging. Beam conditions were 610 uC/cm$^{-2}$ dose of 250 pA at 100 kV (Raith EBPG 5200). After writing, PMMA was developed with MIBK, followed by topography profiling with Alpha-Step 500 (KLA-Tencor Inc.). Reactive-ion etching (RIE, Plasma Therm 790) with CF4 gas was used for transferring the pattern to the layer.

Chips with films and devices were glued to a holder and wire-bonded with aluminum wires (VB16 wedge bonder, Micro Point Pro Ltd.).

Cryogenic Testing

Cryogenic electric and magnetic measurements were done with three different systems: (i) DynaCool Quantum Design Inc. (CA, USA); (ii) BlueFors (Helsinky, Finland) with MFLI lock-in amplifier (Zurich Instruments, Switzerland); (iii) in-house made cryogenic system with Keithley 236 (Keithley Instruments, Tektronix OH, USA) and Yokogawa 651 (Yokogawa Electric, Tokyo, Japan) multimeters and an SR830 (Stanford Research Systems, CA, USA) lock-in amplifier. SQUID measurements were done at 100-12000 Hz, allowing examination of measurement reproducibility. Amorphous molybdenum silicide and tungsten silicide films (4-1000 nm in thickness) with respective $\alpha Mo_{81}Si_{19}$ and $\alpha W_{60}Si_{40}$ stoichiometry were deposited on a flexible polymer substrate by means of magnetron sputtering, while the former was also sputtered on silicon-chip, glass, ferroelectric and layered-material substrates (see Materials and Methods for details). Film thickness, amorphous structure and chemical composition were determined with ellipsometry, X-ray diffraction (XRD) and X-ray photoelectron spectroscopy (XPS, for molybdenum silicide films), respectively. Planar SQUIDs were fabricated with electron-beam lithography with high yield on various substrates. Samples were characterized electrically in three different systems with high reproducibility.

Example 1

Effect of Curvature on Physical Properties of Squid

The inventors successful implemented SQUIDs made of amorphous superconducting materials on a SiO/Si substrate, an amorphous glass substrate, and adhesive polymer (kapton-tape) substrate. Various superconductor materials have been successfully utilized for the fabrication of exemplary devices (e.g. SQUIDs), such as Nb, NbN, $Mo_{81}Si_{19}$, and $W_{60}Si_{40}$. Measurements of the transition temperature from normal to superconductor of amorphous superconducting coating on Si/SiO chip, amorphous glass substrate, van-der Waals material (mica), crystalline ferroelectric substrate, and adhesive polymer (kapton tape), revealed that the transition temperature remains nearly unchanged for superconducting coatings of these substrates.

The inventors used the reduced film thickness of the amorphous superconductors for obtaining geometrical-assisted flexibility. To allow in-situ characterization of bent devices, samples were synthesized on flexible polyamide adhesive tapes with a thickness t=30 um. Such tapes maintain their mechanical elasticity and adhesion at the superconducting-relevant low temperatures, while they also remain thermally and electrically insulating. To demonstrate the effect of flexure, devices were placed on holders with various radii of curvature (r) while samples were transferred between the holders using the adhesive nature of the flexible tapes. The SQUIDs were placed with the weak links parallel to the arcing cylinder circumference (see FIG. 1A), allowing direct characterization of devices under variable strain conditions.

Figure 13:
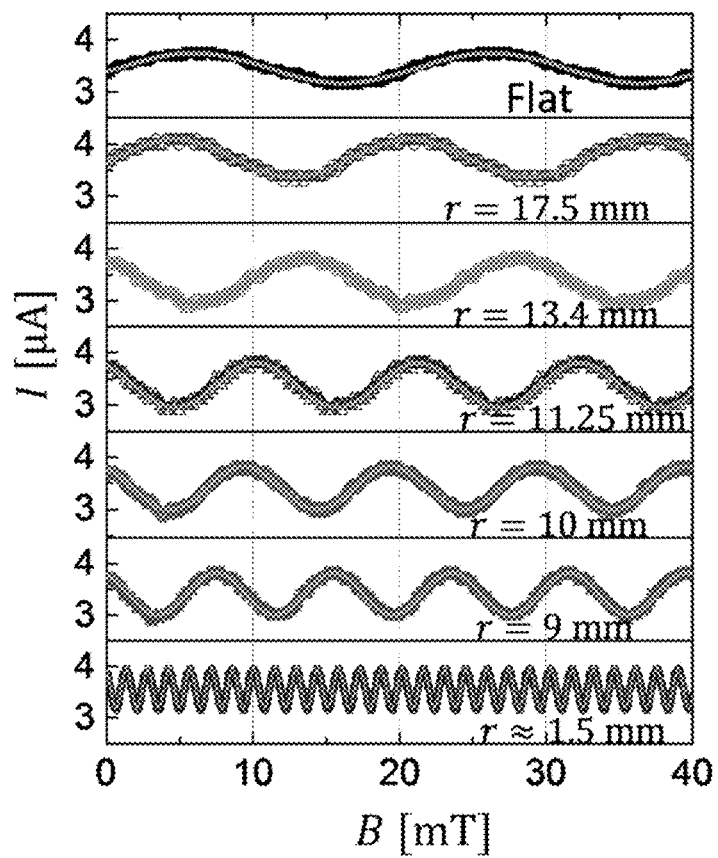
FIG. 13 is a graph representing the effect of bending on interference periodicity (magnetic field sensing and quantum-state tunability) in flexible SQUIDs for a large set of curvatures. Interference pattern of SQUIDs with varying radii of curvature (marked in the figure). Gray lines are the best fits for a sine function.

FIG. 13 shows the effect of bending on flexible SQUIDs. FIG. 13 demonstrates the interference pattern of a flat $\alpha Mo_{81}Si_{19}$ SQUID (having horizontal dimensions of 500 nm×500 nm) with 20.42 mT periodicity (the device geometry follows FIG. 1C). Bending the same device by transferring the adhesive tape to sample holders of different curvatures and placing the SQUID at the center of the holder changed the interfering periodicity. FIG. 13 shows that bending the sample with r=17.5 mm and r≈1.5 mm reduced the interference periodicity to 16.06 mT and 1.44 mT, respectively, indicating on an order of magnitude change between curved and flat devices.

The dependence of periodicity on bending curvature (κ≈1/r) has been evidenced experimentally. Periodicity decreases linearly with curvature for large r values according to Equation (2) $B_{0κ}/B_{0Flat}=1.007-7.05κ$, where $B_{0κ}$ and $B_{0Flat}$ are the periodicities of the curved and flat devices, respectively, and κ is given in mm$^{-1}$. Likewise, $αW_{60}Si_{40}$ SQUID (having horizontal dimensions of 500 nm×500 nm) exhibited a similar dependence of periodicity on bending curvature of the flexible device. Thus it has been postulated, that the linear dependence of periodicity on the bending curvature is accurate for any superconductor material and for any geometry of SQUID.

SQUID parameters of different device material and geometry for various flexing curvatures are summarized in Table 1.

TABLE 1

| SQUID | r [mm] | κ [mm$^{-1}$] | $B_0$ [mT] |
|---|---|---|---|
| Large $aMo_{81}Si_{19}$ | ∞ | 0 | 12.20 |
| | 17.50 | 0.06 | 9.20 |
| | 13.33 | 0.08 | 8.15 |
| | 11.25 | 0.09 | 6.50 |
| | 10.00 | 0.10 | 5.80 |
| | 9.17 | 0.11 | 4.60 |

TABLE 1-continued

| SQUID | r [mm] | κ [mm$^{-1}$] | $B_0$ [mT] |
|---|---|---|---|
| Square $aW_{60}Si_{40}$ | ∞ | 0 | 19.88 |
| | 11.25 | 0.09 | 8.4 |

To examine the effect of bending on superconductivity, the inventors processed 2000×100×15 nm$^3$ nanowires near the SQUIDs and tested them under the same flexing conditions of FIG. 13 (wires were parallel to the bending direction). The wires have been current-biased and the resultant voltage have been measured under variable temperature and magnetic field conditions.

Table 2 provides periodicity ($B_0$) and amplitude ($δI_c$) of the interference pattern as extracted from the best fits to a sine wave. The statistical parameter $χ^2$ is introduced for each best-fit analysis.

TABLE 2

SQUID parameters for various flexing curvatures

| r [mm] | κ [mm$^{-1}$] | $B_0$ [mT] | $δI_c$ [μA] | $χ^2$ |
|---|---|---|---|---|
| ∞ | 0 | 20.42 | 0.29 | 0.0006 |
| 17.50 | 0.06 | 16.06 | 0.36 | 0.0018 |
| 13.33 | 0.08 | 14.52 | 0.42 | 0.0011 |
| 11.25 | 0.09 | 11.06 | 0.43 | 0.0020 |
| 10.00 | 0.10 | 10.04 | 0.41 | 0.0014 |
| 9.17 | 0.11 | 8.02 | 0.40 | 0.0013 |
| 1.5 | 0.66 | 1.44 | 0.36 | 0.0014 |

Table 3 provides the extracted critical magnetic field, current and temperature as well as coherence length, and electron density.

TABLE 3

Effects of curvature on superconductive properties

| r [mm] | κ [mm$^{-1}$] | $T_c$ [K] | $I_c$ [μA] | $B_c$ [T] | ξ [nm] | $n_e$ [10$^{29}$ m$^{-3}$] | 2Δ [meV] |
|---|---|---|---|---|---|---|---|
| ∞ | 0 | 6.97 | 3.55 | 7.77 | 6.51 | 3.24 | 2.12 |
| 17.50 | 0.06 | 6.91 | 3.63 | 7.95 | 6.44 | 3.32 | 2.10 |
| 13.33 | 0.08 | 6.88 | 3.65 | 8.02 | 6.41 | 3.37 | 2.09 |
| 11.25 | 0.09 | 6.8 | 3.89 | 8.13 | 6.37 | 3.58 | 2.07 |
| 10.00 | 0.10 | 6.73 | 3.79 | 8.21 | 6.33 | 3.49 | 2.05 |
| 9.17 | 0.11 | 6.62 | 3.84 | 8.38 | 6.27 | 3.54 | 2.01 |

Critical temperature, critical current and critical magnetic field as well as coherence length ($\xi$) of 2000×100×15 nm³ wires as a function of curvature. These parameters are calculated for T=0 K from experimental data obtained by the inventors (not shown). The film electron density at the normal state ($n_e$) and Cooper-pair binding energy (2Δ) are also presented herein.

As represented by Table 3, the critical magnetic field ($B_C$) increases with increasing r for all temperatures, while it was extracted that at T=0 K, $B_c$(r=∞)=7.77 T and $B_c$(r=9 mm)=8.4 T. Additionally, it was found, that at 1.9 K, $I_s$(r=∞)=3.55 uA and $I_s$(r=9 mm)=3.84 uA. As opposed to the trend in $B_c$, the difference in $I_s$ between small and large curvatures reduces with increasing temperature until there is a crossover at T=5.4 K, above which the smaller curvature is accompanied by lower $I_s$.

Figure 15:
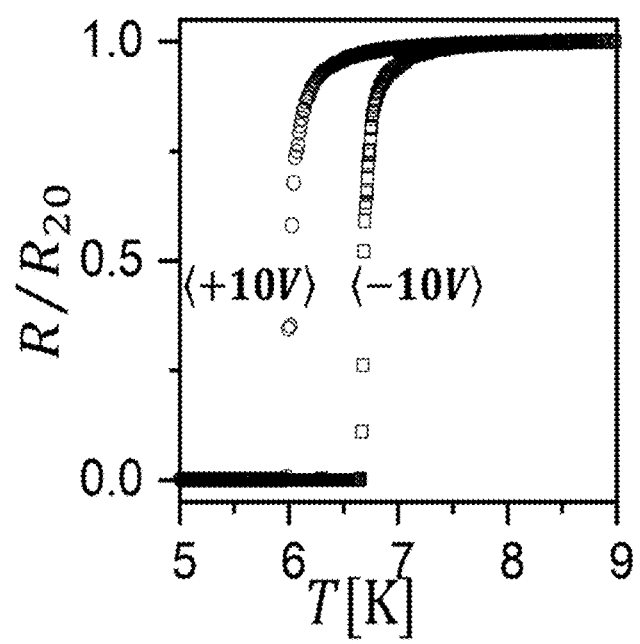
FIG. 15 is a graph representing superconducting transition temperature (and quantum state) of an amorphous superconducting coating on a ferroelectric substrate when a positive voltage is applied to the ferroelectric substrate ($T_c$=6.7K) and when a negative voltage is applied on the ferroelectric substrate ($T_c$=5.7K).

In some embodiments, the sensitivity of the flexible SQUID to a magnetic field is controllable by modifying the geometric shape thereof. Interference pattern of the nano-SQUID (see FIG. 9A) critical current as a function of external magnetic field demonstrates sensitivity to a single quantum fluxon (periodicity). The interference pattern resulting from the three terminal SQUID (see FIG. 9C), when a gating current is applied to the JJ results in amplitude (Δ) and phase (θ) tunability of the pseudo wavefunction. $\psi=\Delta e^{i\theta}$ FIG. 15 shows local electric-field modulation of the quantum state of a superconducting-functional material heterostructures. Superconducting transition temperature of an amorphous superconducting coating on a ferroelectric substrate when an: 'on' (positive) voltage is applied to the ferroelectric and when an 'off' (negative) voltage is applied on the ferroelectric, showing that heterostructures of amorphous superconductors and functional materials can allow augmented functionality.

Example 2

Tunability of Hybrid Compositions

The ferroelectric-superconducting hybrid devices disclosed in the instant invention may have various configurations or complexity. A first non-limiting configuration of an exemplary device is based on a polarization-induced field effect (see FIGS. 3A-D). Here, determining locally the polarization orientation of the ferroelectric film (or pattern) is giving rise to switching between suppressed and enhanced superconducting state, e.g., lowering or increasing critical current of the superconductor ($\Delta I_C$) locally. That is, the ferroelectric polarization engineering allows us to form a tunable superconducting weak link. This switchable weak link serves as a 'bit.' Connecting it in parallel to an addition JJ (either a superconducting weak link or an addition ferroelectric-superconducting element) allows us to have a quantum-fluxon based cell. In the ferroelectric-superconducting stack (continuous films of patterns), the polarization of the ferroelectric suppresses locally the superconducting properties, e.g. decreasing $I_C$ (FIG. 3A). The ferroelectric polarization can be artificially manipulated for switching $I_C$ between suppressed and enhanced states, i.e. a bit element (FIG. 3B). The switched weak link can be wired in parallel to either a bear superconducting weak link (FIG. 3C) or to a twin ferroelectric-superconducting element with tunable superconducting properties (FIG. 3D) to complete the fluxon-based binary device.

A second non-limiting configuration of an exemplary device is based on a polarization-sensitive tunneling. Here, the ultra-thin ferroelectric structure is sandwiched between two superconducting element, so that the supercurrent tunnels through the ferroelectric (FIGS. 4 and 5). However, the current that flows via the ferroelectrics depends on the tunneling barrier, which in turn depends on the polarization state of the ferroelectric. Because the current flow through the ferroelectric can affect the polarization and hence the tunneling barrier, the obtained device exhibits quantum-based memristive behavior.

A third non-limiting configuration of an exemplary device is based on a three-terminal superconducting device. Here, a current injected to a weak link helps tuning the phase and amplitude of the wave function (i.e., the order parameter) across the junction. Introducing the polarization-induced field effect design to this three-port superconducting device induces memristive behavior to a quantum-switching device (FIG. 6). FIGS. 6A-C represent exemplary configurations of three-terminal superconducting switching device, being characterized by a polarization-induced field effect memristive behavior. FIG. 6A represents a polarization-induced weak link that is combined with a three-terminal superconducting switching device (FIG. 6B), which in turn is interfering with an unperturbed weak link (FIG. 6C) allows to introduce memristivity to the quantum switching device.

Figure 16A:
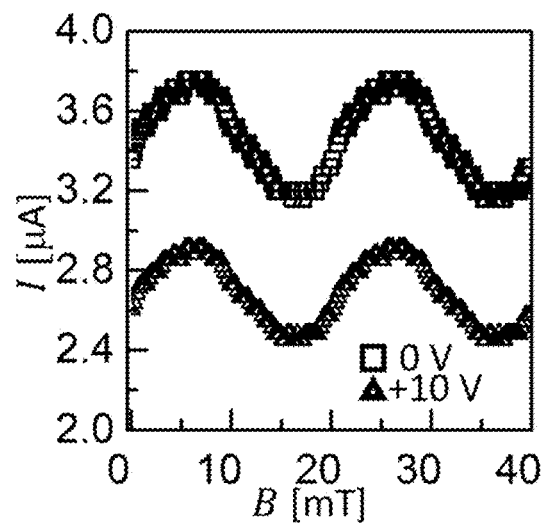
FIGS. 16A-B are graphs representing tunability of physical properties of exemplary SQUIDS of the invention.
Figure 16B:
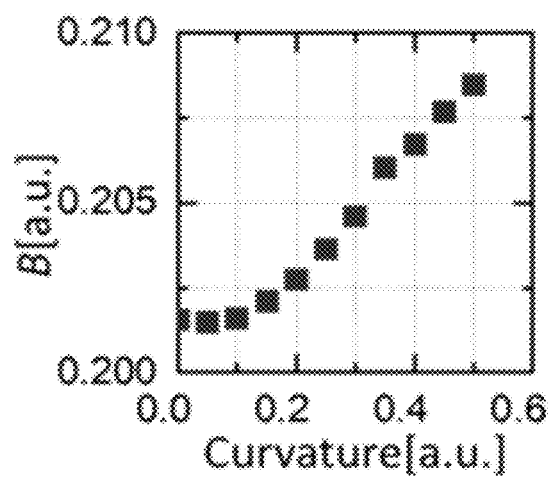

As exemplified by FIG. 15, Tc (and hence ΔTc) of the ferroelectric-superconducting hybrid composition is adjustable (e.g. decreases by applying negative voltage, and increases by applying positive voltage to the ferroelectric layer) with external electric field. Furthermore, as represented by FIG. 16A, the critical current of the hybrid composition is adjustable (e.g. decreases by applying voltage to the ferroelectric layer), together with an adjustable (increasing) magnetic field strength (see FIG. 16B).

Without being limited to any particular theory, the inventors provide a simplified mathematical model to describe tunneling through superconducting-ferroelectric-superconducting (SFS) junction. Ferroelectric (FE) materials are referred to as having two stable states. The simplest model Hamiltonian for this system is expressed by Equation 3:

$$H_F = \frac{p^2}{2m} + \alpha x^2 (x - x_0)^2 \qquad (3)$$

Here, the first term describes the inertia of the ferroelectric material, i.e. its stability to external perturbations. The other two terms describe a double well with minima at x=0 and x=$x_0$. This can be easily extended to ferroelectrics with more than two states. In addition to the internal degrees of freedom, we should take into account coupling to external degrees of freedom, giving rise to a dissipative rate η.

A Josephson Junction can be represented by common Josephson Hamiltonian (Equation 4)

$$H_S = \frac{1}{2} E_C n^2 + E_J \cos(\phi) + I\phi \qquad (4)$$

Here, $E_C$ is the charging energy of the cavity and $E_J=\hbar J$, where J is the tunneling rate of Cooper pairs, and I is the current through the junction.

Clearly, the most interesting part of this model is related to the coupling between the Josephson junction and the ferroelectric. This coupling can occur through multiple channels. The simplest of these channels is the effect of the ferroelectric on the tunneling rate J. Assuming a device with a large on-to-off ratio, we consider a situation in which the x=0 state has negligible conductance with respect to the x=0 state. This model can be represented by the substitution J→βx, leading to the Hamiltonian (Equation 5):

$$H_{SFS} = \frac{p^2}{2m} + \alpha x^2(x-x_0)^2 + \frac{1}{2}E_C n^2 - \beta x \cos(\phi) - V\phi \quad (5)$$

The last term of this Hamiltonian describes two key features of an SC-FE-SC junction: the state of the ferroelectric x affects the current of the junction, and vice versa. This coupling can be visualized by computing the equations of motion associated with the Hamiltonian $H_{SFS}$ (Equation 6):

$$\dot{p} = -2\alpha x(x-x_0)^2 - 2\alpha x^2(x-x_0) + \beta\cos(\phi) - \eta p \quad (6)$$
$$\dot{x} = \frac{p}{m}$$
$$\dot{n} = -\beta x \sin(\phi) + I$$
$$\dot{\phi} = E_c n$$

Experimental results obtained by the inventors (see FIG. 7) demonstrate the main features of some of the exemplary devices disclosed herein.

Low current (FIGS. 7A-B): the FE is in the "on" state (x=x₀) and the Josephson junction behaves as a superconductor (zero voltage+Josephson oscillations).

High current (FIGS. 7C-D): the FE is in the "off" state (x=0) and the Josephson junction behaves as a normal function (finite voltage).

Hysteretic behavior (FIGS. 7E-F): the current is swept slowly from $I_0$ to $I_{max}$ and vice versa. The FE is initialized in an "on" state and the junction superconducts. When the voltage passes through a critical valueI*, the FE goes "off" and junction becomes normal. The marked asymmetry of this plot indicates a strong hysteretic behavior.

In the numerical calculations shown in FIG. 7 it has been assumed all physical parameters $E_C$, α, β, η, m, $x_0$ being equal 1.

Figure 8:
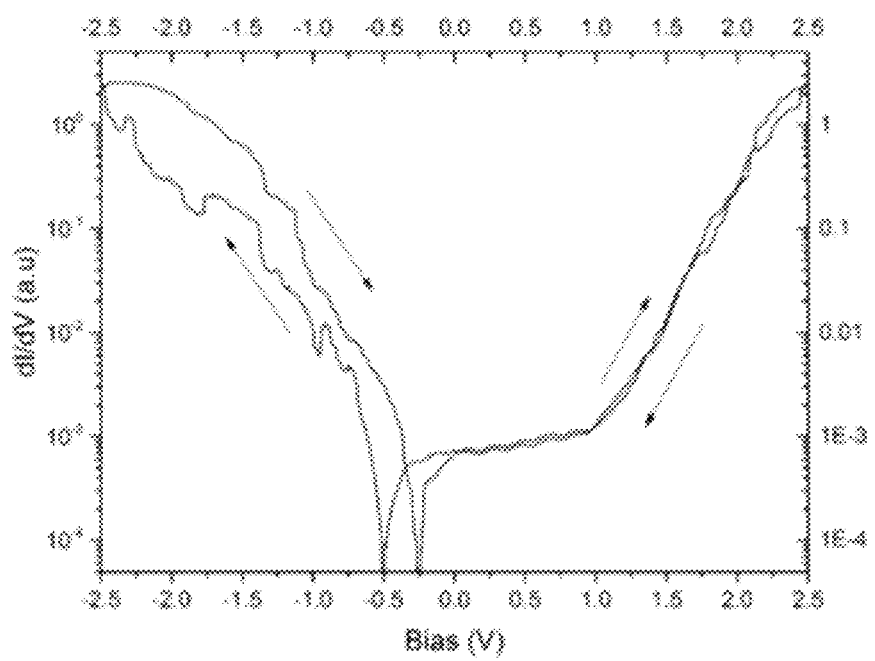
FIG. 8 is a graph showing tunneling behavior of ferroelectrics. Hysteretic tunneling behavior of an ultra-thin (3-nm thick) PZT film, measured with scanning tunneling microscopy (V(bias)=2V; I(setpoint)=1 nA).

The inventors successfully manufactured a hybrid composition comprising an ultra-thin (~3 nm) $PbZr_{0.2}Ti_{0.8}O_3$ film. The hybrid composition exhibited hysteretic tunneling behavior (see FIG. 8), measured by scanning tunneling microscopy ($V_{bias}$=2V; $I_{setpoint}$=1 nA).

The inventors successfully manufactured a hybrid composition comprising a thin (<20 nm) film of NbN on top of a ferroelectric PZT film (after verifying that the ferroelectric film behaves as expected). The resultant NbN film demonstrated superconductivity with satisfactory properties, such as $T_c$>9 K (FIG. 9).

The inventors successfully manufactured a nanoscale SQUID composed of both ferroelectric and superconducting materials (e.g. hybrid SQUID). The manufacturing conditions for the hybrid SQUID disclosed herein are as described in the Example 1.

Figure 10A:
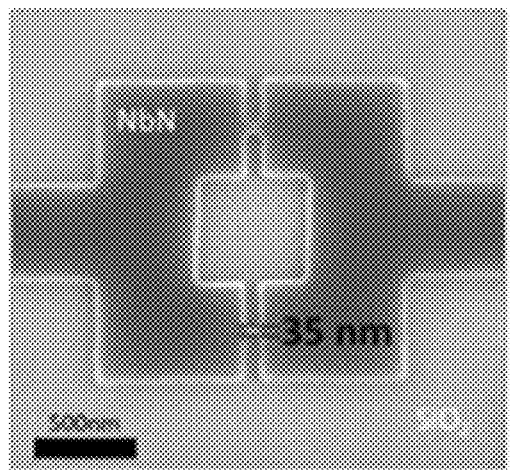
FIGS. 10A-B are images showing nano-scaled Superconducting Quantum Interference Devices (nano SQUIDs).
Figure 10B:
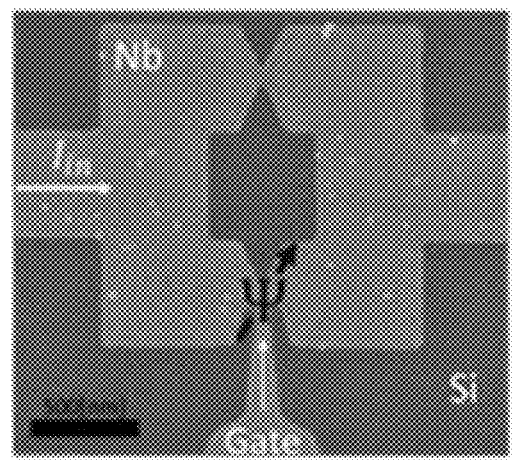
Figure 11A:
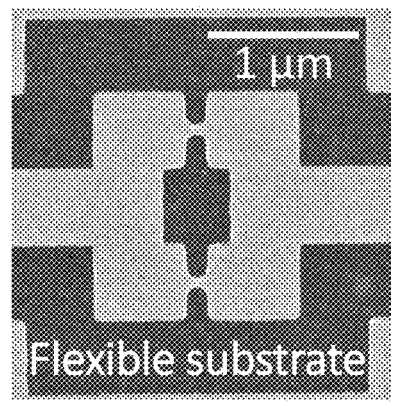
FIGS. 11A-D are images showing devices made of amorphous superconducting coatings on various substrates. Electron micrographs of amorphous superconducting MoSi SQUIDs on adhesive polymer (kapton tape) (FIG. 11A), a glass substrate (FIG. 11B), SiO/Si substrate (FIG. 11C) and PZT substrate (FIG. 11D).
Figure 11B:
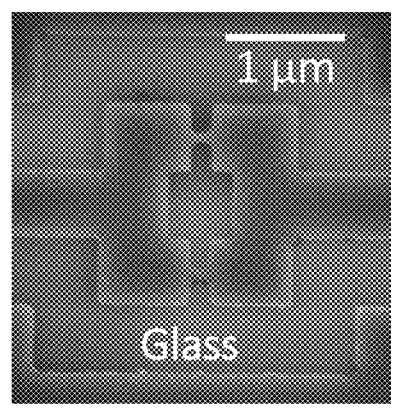
Figure 11C:
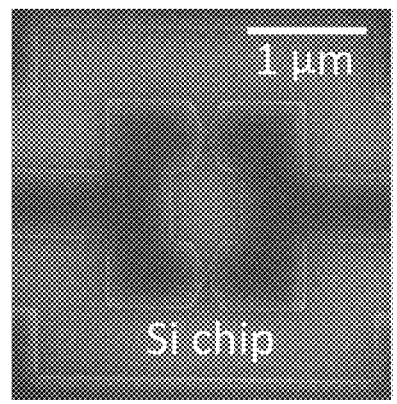
Figure 11D:
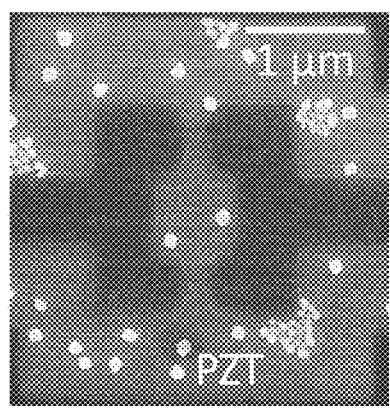

FIG. 10A demonstrates a superconducting loop made of an ultra-thin (~5 atomic monolayers) niobium nitride film and comprises two parallel patterned JJs (having a thickness of about 35 nm). Critical current interference pattern of the abovementioned nano-SQUID is controllable by applying external magnetic field. Accordingly, such nano-SQUID demonstrates sensitivity to a single quantum fluxon (periodicity).

Another, nano-SQUID has been fabricated (FIG. 10B), comprising thin niobium film, with the exception that one of the JJs is a three-terminal junctions that allows current gating for local tunability of Ψ. By applying a gating current to the JJ of the abovementioned three terminal nano-SQUID, induces both amplitude (Δ) and phase (θ) tunability of the pseudo wave function.

The inventors coated a highly tetragonal 40-nm thick $PbZr0.1Ti0.9O3$ (PZT) ferroelectric film (on a $DyScO3$ substrate, with $SrRuO3$ bottom electrode) that is known for its large remnant polarization and high piezoelectric coefficient. Given the above observations, mechanical deformation of the piezoelectric material may also affect Tc. Therefore, the inventors propose that for future applications, individual SQUIDs will be tunable electrically, using micro electro-mechanical systems (MEMS), including piezoelectrics. The convenient growth conditions of amorphous superconductors assist maintaining a clean interface with the ferroelectric, which is important for such devices.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of manufacturing a composition comprising one or more amorphous superconductor layer bound to one or more substrate layer, wherein said one or more substrate layer comprises any of: a Van der Waals material, an amorphous material, or a combination thereof; and wherein said one or more amorphous superconductor layer is a continuous film, the method comprises the steps of:
   a. introducing said substrate selected from Van der Waals material, amorphous material, or a combination thereof into an ambient of reduced pressure, wherein said substrate being under controlled temperature;
   b. providing a target under conditions sufficient for sputtering, wherein said target comprises one or more elements selected from the group consisting of: tungsten (W), molybdenum (Mo), titanium (Ti), tantalum (Ta), niobium (Nb), nickel (Ni), cobalt (Co), zirconium (Zr), lanthanum (La), germanium (Ge), gallium (Ga), lead (Pb), beryllium (Be), zinc (Zn), ruthenium (Ru), rhodium (Rh), bismuth (Bi), indium (In), tin (Sn), palladium (Pd), gold (Au), osmium (Os), iridium (Ir), nitrogen (N), oxygen (O) and silicon (Si) or any combination thereof;
   c. sputtering said one or more elements onto said substrate, thereby manufacturing the amorphous superconductor layer on said substrate; wherein said sputtering is performed at a temperature below 500 C.

2. The method of claim 1, further comprising repeating step (c), thereby manufacturing a plurality of superconductor layers on said substrate; and wherein said substrate is a polymeric material.

3. The method of claim 1, wherein said controlled temperature is less than 70° C.

4. The method of claim 1, wherein said conditions comprise vacuum and plasma irradiation.

* * * * *